(12) United States Patent
Schmidt et al.

(10) Patent No.: US 12,003,081 B2
(45) Date of Patent: Jun. 4, 2024

(54) CABLE RECEIVING DEVICE, CABLE HARNESS AND METHOD

(71) Applicant: DELFINGEN FR-ANTEUIL S.A., Anteuil (FR)

(72) Inventors: Harald Schmidt, Gilching (DE); Jochen Rührseitz, Munich (DE)

(73) Assignee: DELFINGEN FR-ANTEUIL S.A., Anteuil (FR)

( * ) Notice: Subject to any disclaimer, the term of this patent is extended or adjusted under 35 U.S.C. 154(b) by 925 days.

(21) Appl. No.: 17/040,664

(22) PCT Filed: Mar. 25, 2019

(86) PCT No.: PCT/EP2019/057446
§ 371 (c)(1),
(2) Date: Sep. 23, 2020

(87) PCT Pub. No.: WO2019/185549
PCT Pub. Date: Oct. 3, 2019

(65) Prior Publication Data
US 2021/0021113 A1    Jan. 21, 2021

(30) Foreign Application Priority Data
Mar. 26, 2018   (DE) .................... 10 2018 107 116.7

(51) Int. Cl.
*H02G 3/00*   (2006.01)
*B60R 16/02*   (2006.01)
(Continued)

(52) U.S. Cl.
CPC ....... *H02G 3/0437* (2013.01); *B60R 16/0215* (2013.01); *F16L 3/1075* (2013.01);
(Continued)

(58) Field of Classification Search
CPC . H02G 3/0437; B60R 16/0215; F16L 3/1075; F16L 3/26; H05K 9/0075; H05K 9/0098
See application file for complete search history.

(56) References Cited

U.S. PATENT DOCUMENTS

2003/0159846 A1   8/2003  Takahashi et al.
2005/0133245 A1*  6/2005  Katsuyama .......... H01R 13/719
                                                  174/75 C
(Continued)

FOREIGN PATENT DOCUMENTS

CN   202759197 U    2/2013
CN   106300162 A    1/2017
(Continued)

OTHER PUBLICATIONS

JP 2015027205 A; English Translation (Year: 2015).*
(Continued)

*Primary Examiner* — Pete T Lee
(74) *Attorney, Agent, or Firm* — Alleman Hall & Tuttle LLP

(57) ABSTRACT

A cable receiving device for a cable harness, comprising: a magnetic element for absorbing electromagnetic radiation, and a plastic molded part, wherein the plastic molded part comprises a cable guiding section for guiding a cable strand of the cable harness and a receiving section for receiving the magnetic element, and wherein the magnetic element is fastened in or on the receiving section in a form-locking manner and/or a material-fit manner.

11 Claims, 22 Drawing Sheets

(51) Int. Cl.
  *F16L 3/10*   (2006.01)
  *F16L 3/26*   (2006.01)
  *H02G 3/04*   (2006.01)
  *H05K 9/00*   (2006.01)

(52) U.S. Cl.
  CPC .............. *F16L 3/26* (2013.01); *H05K 9/0075* (2013.01); *H05K 9/0098* (2013.01)

(56) References Cited

U.S. PATENT DOCUMENTS

2007/0144761 A1\* 6/2007 Kim ................ H01B 11/06
                                                    174/102 R
2021/0181443 A1\* 6/2021 Zhou .................... G02B 6/3825

FOREIGN PATENT DOCUMENTS

| DE | 4334732 | A1 | 4/1994 |
| DE | 102013220564 | A1 | 4/2015 |
| DE | 102015205815 | A1 | 10/2016 |
| EP | 3046195 | A1 | 7/2016 |
| EP | 3312854 | B1 | 3/2020 |
| JP | S61268543 | A | 11/1986 |
| JP | 2002164219 | A | 6/2002 |
| JP | 2014135871 | A | 7/2014 |
| JP | 2015015828 | A | 1/2015 |
| JP | 2015027205 | A | 2/2015 |
| JP | 6083344 | B2 | 2/2017 |
| WO | 2016204188 | A1 | 12/2016 |

OTHER PUBLICATIONS

DE 102018217839 A1; filed on Oct. 18, 2018; English Translation (Year: 2018).\*
DE102013220564A; English Translation (Year: 2013).\*
DE 102017116445 A1 published on Oct. 25, 2018; English Translation (Year: 2018).\*
European Patent Office, Office Action Issued in Application No. 19713773.0, dated May 17, 2022, Germany, 16 pages.
China National Intellectual Property Administration, Office Action and Search Report Issued in Application No. 201980021315.5, dated May 6, 2021, 16 pages.
European Patent Office, Office Action Issued in Application No. 19713773.0, dated Aug. 7, 2023, Netherlands, 10 pages.

\* cited by examiner

CABLE RECEIVING DEVICE, CABLE HARNESS AND METHOD

FIELD

The present invention relates to a cable receiving device for a cable harness, a cable harness with such a cable receiving device and a method for manufacturing such a cable receiving device.

BACKGROUND

For the wiring system of a motor vehicle or for cables in industrial plants, cable ducts, cable channels and/or connecting elements, for example, to guide and/or hold the cables, can be used. The controlled guidance of the cables with the help of such cable ducts, cable channels and/or connecting elements facilitates the assembly and installation of the cables. Such cable ducts, cable channels and/or connecting elements are usually manufactured by means of a plastic injection molding process or an extrusion process using thermoplastic raw materials. For safe and reliable operation of the wiring system, for the control of electronic components and for the operation of antennas, the requirements for electromagnetic compatibility must also be complied with and precautions must be taken for a trouble-free operation. For this purpose, the cable harness can be traversed by several magnetic components, such as rod-shaped or ring-shaped magnetic shaped bodies, at points susceptible to interference. Such ferrite-based magnetic moldings are usually manufactured by pressing ferrite powder. The pressed moldings are then debound, sintered and aligned by means of an external magnetic field. Since these magnetic elements are usually not directly connected to the cable ducts, cable channels and/or connecting elements, exact positioning of the magnetic elements is complex.

SUMMARY

Against this background, one task of the present invention is to provide an improved cable receiving device.

Accordingly, a cable receiving device for a cable harness is proposed. The cable receiving device comprises a magnetic element for absorbing electromagnetic radiation, and a plastic molded part, wherein the plastic molded part comprises a cable guiding section for guiding a cable strand of the cable harness and a receiving section for receiving the magnetic element, and wherein the magnetic element is fastened in or on the receiving section in a form-locking manner and/or a material-fit manner.

The fact that the plastic molded part has the cable receiving section and the receiving section ensures, on the one hand, that the cable strand is guided in the plastic molded part and, on the other hand, that the magnetic element is arranged at an exactly defined position on the cable strand. In this way, the requirements for electromagnetic compatibility can be reliably met.

The cable receiving device is preferably a cable duct, a cable channel or a fastening element for fixing the cable harness, for example to a car body. Preferably, the cable guiding section and the receiving section are arranged next to each other. Furthermore, the receiving section can also be part of the cable guiding section. By the term "guiding" the cable strand, is meant that the cable guiding section extends along a longitudinal direction of the cable strand. The cable strand is thus guided along its longitudinal direction by the cable guiding section. The cable guiding section can be straight or curved. A form-fit connection is created by engaging at least two connecting partners, in this case the magnetic element and the receiving section, into each other or behind each other. This means that the magnetic element can be snapped or latched into the receiving section, for example. This ensures a secure fastening of the magnetic element in the receiving section.

Alternatively, or additionally, the magnetic element can also be bonded to the holding section in a material-fit manner. In the case of material-fit connections, the connection partners are held together by means of atomic or molecular forces. Material-fit connections are non-detachable connections that can only be separated by destroying the connecting elements. A material-fit connection can be achieved by adhesive bonding, for example. Furthermore, a material-fit connection can also be achieved by producing the magnetic element and the plastic molded part in one and the same injection mold using a multi-component injection molding process. This ensures a particularly good connection between the plastic molded part and the magnetic element. The magnetic element can be injection molded from a compound comprising a thermoplastically processable plastic and a ferrite powder. The cable strand can comprise any number of cables or wires.

According to an embodiment, the cable guiding section is tubular or trough-shaped.

A "tubular" cable guiding section means that it is closed around its circumference. For example, the cable guiding section can have a circular or rectangular geometry in cross-section. A "trough-shaped" cable routing section means that it is open on at least its side, whereby the cable harness can be inserted through the open side. Preferably a first cable guiding section and a second cable guiding section are provided, between which the receiving section is located. The cable guiding sections are preferably connected to the receiving section integrally, especially in one piece of material.

According to another embodiment, the cable receiving device is configured to connect a first corrugated tube of the cable harness to a second corrugated tube of the cable harness.

For this purpose, end sections of the corrugated tubes can be accommodated in the cable receiving device. The cable receiving device can have engagement elements or engagement sections which are suitable for engaging in wave troughs of the corrugated tubes in order to connect the cable receiving device with the corrugated tubes in a form-locking manner.

According to another embodiment, the receiving section has at least one latching hook which engages around the magnetic element in a form-locking manner.

The number of snap-in hooks or latching hooks is unlimited. At least two latching hooks are preferred. The latching hooks are spring-elastic deformable. This allows the magnetic element to be pressed into the receiving section, whereby the latching hooks deform elastically and grasp or engage behind the magnetic element. Furthermore, the magnetic element can also be inserted into a cavity of an injection mold and the latching hooks can be injected directly around or onto the magnetic element during the production of the plastic molded part. The latching hooks are spaced apart from each other, especially in the longitudinal direction. In particular, the latching hooks engage in a recess provided on the magnetic element, through which the cable strand is routed.

According to another embodiment, the plastic molded part has a first molded part section and a second molded part section, wherein the first molded part section is pivotably connected to the second molded part section by means of a hinge, or wherein the first molded part section and the second molded part section are two separate components.

In particular, the first molded part section, the hinge and the second molded part section are designed integrally, in particular in one piece of material. The first molded part section and the second molded part section can each have the shape of a half-shell. The cable guiding section can be formed on both the first molded part section and the second molded part section or only on one of the molded part sections. Likewise, the receiving section can be formed on both molded part sections or only on one of the molded part sections. The hinge can be a thin-walled web or a film hinge.

According to another embodiment, the magnetic element comprises a first magnetic element section, which is received in the first molded part section, and a second magnetic element section, which is received in the second molded part section.

The magnetic element sections can have the form of cylindrical half-shells between which the cable strand can be arranged. The magnetic element can also be in one piece and have a ring-shaped geometry. Furthermore, the magnetic element can also be C-shaped or U-shaped. A C-shaped or U-shaped geometry comprises a bottom and two side walls positioned at a distance from and parallel to each other, which are connected to the base integrally.

According to another embodiment, the magnetic element is in one piece, wherein the magnetic element is disposed between the first molded part section and the second molded part section.

The fact that the magnetic element is "one-piece" means in particular that the magnetic element is a integral component that is not made up of several magnetic element sections. As mentioned before, the magnetic element can be C-shaped or U shaped.

According to another embodiment, the first molded part section and the second molded part section are connected to each other by means of at least one latching hook in a form-locking manner.

Preferably, a large number of such snap-in or latching hooks is provided. For ex ample, the first molded part section has a large number of recesses and the second molded part section has a large number of latching hooks corresponding to the recesses. When the first molded part section is pivoted relative to the second molded part section by means of the hinge, the latching hooks engage in the corresponding recesses, allowing the plastic molded part to be moved from an open state to a closed state. In the open state, the cable strand can be inserted into the plastic molded part. Furthermore, the second molded part section can also be a cap nut and the first molded part section can be an anti-kink module. In this case, the anti-kink module can be placed on the cap nut with the magnetic element between the cap nut and the bend protection. In this case, the cable receiving device is a cap nut arrangement.

According to another embodiment, the first molded part section and the second molded part section are each U-shaped in cross-section, wherein the first molded part section is arranged at least in sections within the second molded part section, wherein the magnetic element is arranged between the first molded part section and the second molded part section.

The U-shaped geometry can also be described as C-shaped. The magnetic element being U-shaped or C-shaped is also preferred. In particular, the first molded part section, especially the receiving section, lies within the second molded part section. The molded part sections each have a bottom and two side walls spaced apart and parallel to each other, which are connected to the bottom integrally. This results in the U-shaped or C-shaped geometry.

According to another embodiment, the magnetic element is passed through a bottom of the first molded part section.

This means that the magnetic element is positioned at least in sections outside the first molded part section and at least in sections inside the first molded part section. In particular, the aforementioned side walls of the magnetic element are passed through the bottom. The bottom has openings for this purpose. The bottom of the magnetic element is positioned between the bottom of the first molded part section and the bottom of the second molded part section.

According to another embodiment, the second molded part section is divided into a plurality of covers each pivotally connected to the first molded part section by means of a hinge.

In this case, the cable receiving device is preferably designed as a cable duct or cable channel. Preferably, the first molded part section comprises any number of inlets and/or outlets through which individual cables of the cable strand can be led out of or into the plastic molded part. The number of covers is arbitrary. The covers can be closed and opened independently.

According to another embodiment, the magnetic element is arranged at least sectionally outside and at least sectionally inside the receiving section.

For this purpose, the magnetic element can be passed through the bottom of the first molded part section, as mentioned above. The magnetic element is then partially in contact with the outside of the receiving section or the first molded part section.

According to another embodiment, the magnetic element and the plastic molded part are designed integrally.

For example, the cable receiving fixture for this purpose can be manufactured using the multi-component injection molding process explained above. In this case, the magnetic element and the plastic molded part form a single unit. In particular, the magnetic element can be part of the plastic molded part. In this case, areas of the plastic molded part will have magnetic properties.

According to another embodiment, the cable receiving device comprises a first plastic molded part which has the receiving section, and a second plastic molded part which is connected to the first plastic molded part in a form-locking manner.

Any number of plastic molded parts can be provided. For example, the first plastic molded part comprises an annular groove provided on the outside of the cable guiding section, in which a corresponding engagement section of the second plastic molded part engages in a form-locking manner. In this way, any number of plastic molded parts can be connected to each other. In particular, the plastic molded part which has the magnetic element can be used in a modular way. The second plastic molded part can be a so-called Y-distributor.

Furthermore, a cable harness with a cable strand and such a cable receiving device is provided. In this case, the cable strand is guided in or on the cable guiding section, wherein the cable strand is guided along the magnetic element or is passed through the magnetic element.

The cable harness is preferably used in the field of automotive engineering. However, the cable harness can also be used in any other area. For example, the cable harness can also be used for immobile applications, for example in building services engineering, for aircraft, watercraft or rail vehicles.

According to an embodiment, the cable harness further comprises a first corrugated tube and a second corrugated tube, wherein the cable receiving device connects the first corrugated tube to the second corrugated tube.

In particular, the cable receiving device engages for this purpose in the first corrugated tube and in the second corrugated tube in a form-locking manner.

Furthermore, a method for manufacturing such a cable receiving device is proposed. The method comprises the following steps: providing a magnetic element for absorbing electromagnetic radiation, b) producing a plastic molded part in such a way that the plastic molded part has a cable guiding section for guiding a cable strand of the cable harness and a receiving section for receiving the magnetic element, and c) attaching the magnetic element in or on the receiving section in a form-locking manner and/or a material-fit manner.

The plastic molded part is preferably produced using an injection molding process. The sequence of steps a) to c) is arbitrary. In particular, steps a) to c) or at least some of steps a) to c) can be performed simultaneously. If the magnetic element is provided in step a), it can also be produced.

According to an embodiment, in steps b) and c) the magnetic element is insert molded or over-molded by plastic material of the plastic molded part.

This ensures a particularly good and durable connection between the magnetic element and the plastic molded part. An additional step of mounting the cable receiving device is then unnecessary.

According to another embodiment, steps a) to c) are carried out by means of a multi-component injection molding method, wherein the magnetic element is provided by processing in the multi-component injection molding method a composition comprising a thermoplastic and a ferrite powder.

When manufacturing the magnetic element, particles of ferrite powder can be aligned in the injection mold used, which results in the ferrimagnetic properties of the magnetic element. The composition can also be described as a compound. In the multi-component injection molding process, the plastic part is also produced in the same injection mold. This can preferably be done sequentially.

Other possible implementations of the cable receiving device, the cable harness and/or the method also include combinations of features or embodiments not explicitly mentioned before or in the following regarding the embodiments. The expert will also add individual aspects as improvements or additions to the respective basic form of the cable receiving device, the cable harness and/or the method.

Further advantageous embodiments and aspects of the cable receiving device, the cable harness and/or the method are subject of the dependent claims as well as the embodiments of the cable receiving device, the cable harness and/or the method described in the following. In addition, the cable receiving device, the cable harness and/or the method are explained in detail by means of preferred embodiments with reference to the enclosed figures.

DETAILED DESCRIPTION

In the figures, identical or functionally identical elements have been provided with the same reference signs, unless otherwise indicated.

Figure 1:
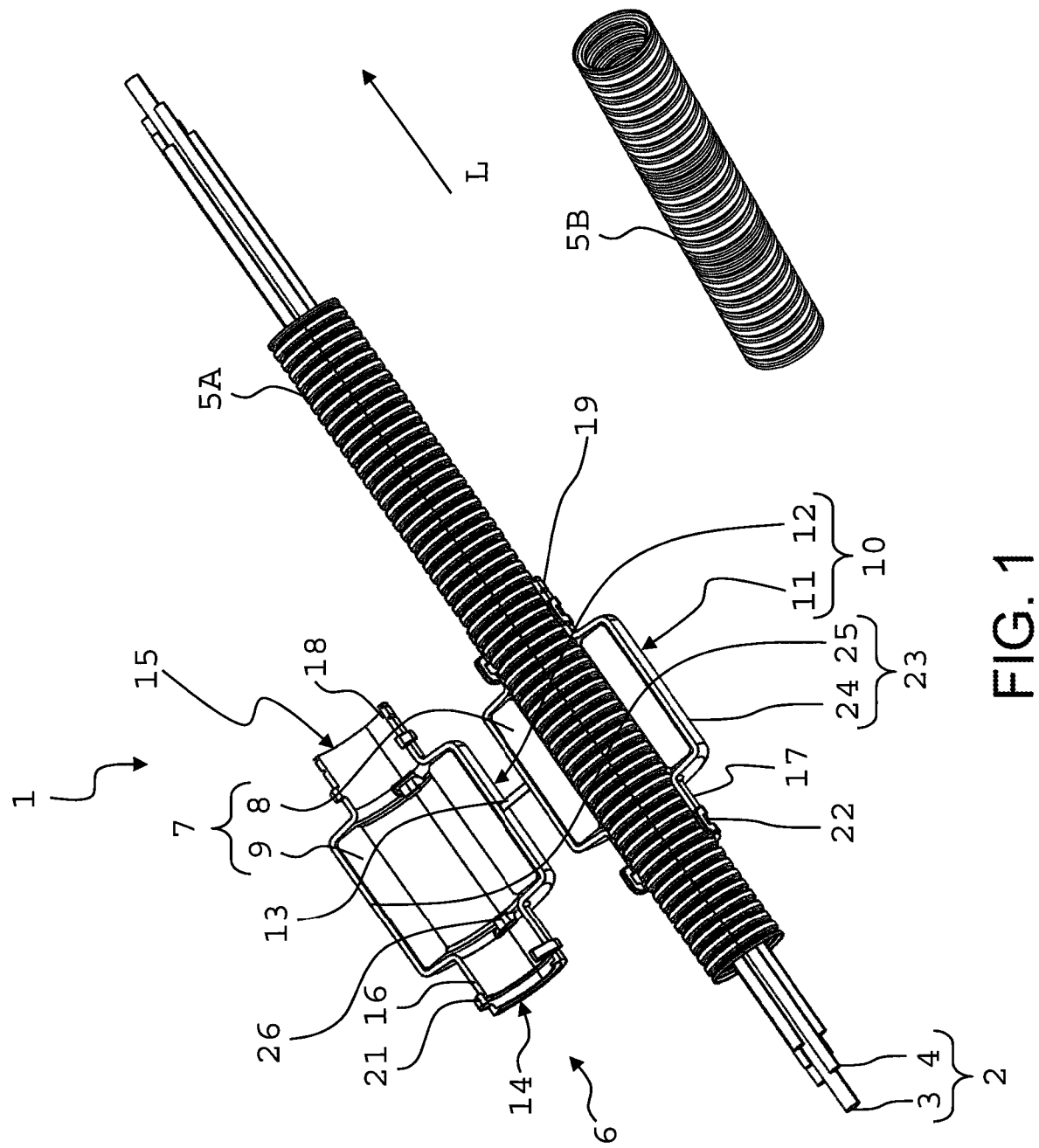
FIG. 1 shows a schematic perspective view of one embodiment of a cable harness.
Figure 2:
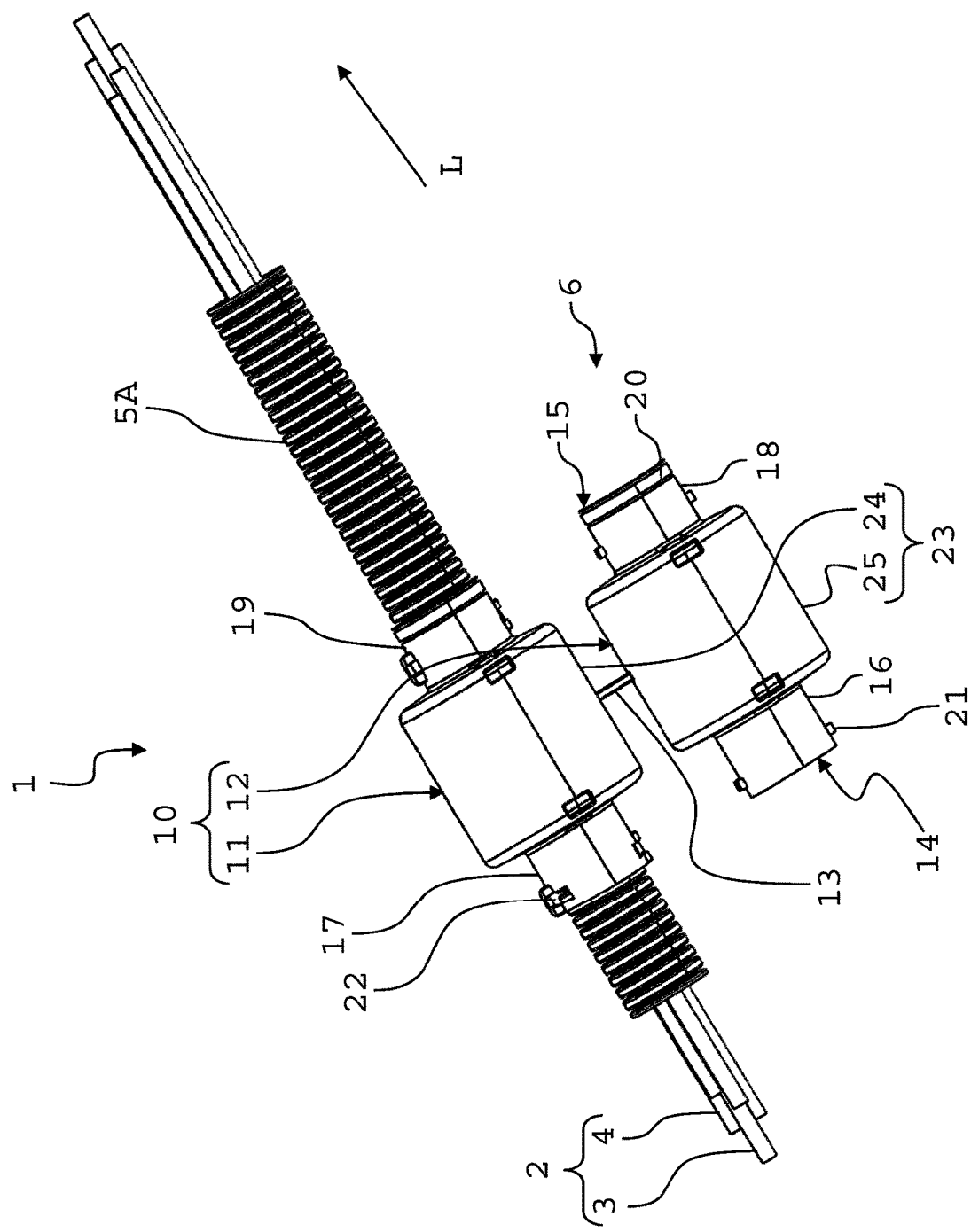
FIG. 2 shows another schematic perspective view of the cable harness as shown in FIG. 1.

FIGS. 1 and 2 each show a schematic perspective view of an embodiment of a cable harness 1. The cable harness 1 comprises a cable strand 2. The cable strand 2 extends in a longitudinal direction L. The cable strand 2 in turn comprises a number of cables 3, 4, of which only two in FIGS. 1 and 2 are provided with a reference sign. The cables 3, 4 can also be referred to as wires. The number of cables 3, 4 is arbitrary. The cables 3, 4 can have identical or different diameters and/or cross sections. The cables 3, 4 can be electrical cables, for example single-phase cables, multi-phase cables, coaxial cables or the like. Furthermore, the cable harness 1 can optionally include a corrugated tube 5A or several corrugated tubes 5A, 5B, through which the cable strand 2 is passed. In particular, a first corrugated tube 5A and a second corrugated tube 5B are provided. Each corrugated tube 5A, 5B has alternating wave troughs and wave crests. The corrugated tube 5A extends in the longitudinal direction L. The corrugated tube 5B can also extend in the longitudinal direction L.

Furthermore, the cable harness 1 includes a cable receiving device 6. The cable harness 1 or the cable receiving device 6 is preferably used in the field of automotive engineering. However, the cable harness 1 or the cable receiving device 6 can also be used in any other area, for example in water vehicles, aircrafts, rail vehicles or in building services engineering. The corrugated tube 5A is at least partially accommodated in the cable receiving device 6 or passed through it. However, the corrugated tube 5A is, as mentioned above, optional. The corrugated tube 5B is also optional.

The cable receiving device 6 is suitable for connecting the corrugated tubes 5A, 5B with each other. For this purpose, end sections of the corrugated tubes 5A, 5B can be accommodated in the cable receiving device 6. The cable receiving device 6 can have engagement elements or engagement sections which are suitable for engaging in the troughs of the corrugated tubes 5A, 5B in order to connect the cable receiving device 6 to the corrugated tubes 5A, 5B in a form-locking manner.

The cable receiving device 6 comprises a magnetic element 7. The magnetic element 7 is in particular a ferrite. Ferrites are electrically poorly conducting or non-conducting ferrimagnetic ceramic materials made of the iron oxide hematite (Fe2O3), more rarely of magnetite (Fe3O4) or other metal oxides. Ferrimagnetism is a cooperative, magnetic phenomenon by which ferrimagnetic materials exhibit magnetization. Such materials have a crystal structure in which the magnetic moments of the atoms are alternately aligned antiparallel within certain areas (so-called Weiss domains) In contrast to the phenomenon of antiferromagnetism, however, they do not completely cancel each other out, since the alignment of the magnetic moments is stronger in one of the two directions. Ferrimagnetism differs from ferromagnetism not in the arrangement of the Weiss domains, but in the magnetic order of the elementary magnets, which results from an energetically favorable alignment. The magnetizations of two adjacent elementary magnets partially cancel each other out, resulting in a significantly weaker magnetization of the Weiss domains. The macroscopic behavior is thus a weaker form of ferromagnetism.

The magnetic element 7 can be divided into two parts and comprise a first magnetic element section 8 and a second magnetic element section 9. The cable strand 2 or the corrugated tube 5A and/or the corrugated tube 5B are led through the magnetic element 7. The first magnetic element section 8 and the second magnetic element section 9 each preferably have a semi-cylindrical geometry with a central recess. The magnetic element 7 itself is thus tubular. The central recess preferably has smooth walls.

In addition to the magnetic element 7, the cable receiving device 6 comprises a plastic molded part 10. The plastic molded part 10 is in particular an injection molded part. For example, the plastic molded part 10 can be made of polyamide (PA), polyethylene (PE), polypropylene (PP) or another suitable thermoplastic. The plastic molded part 10 comprises a first molded part section 11, in which the first magnetic element section 8 is accommodated, and a second molded part section 12, in which the second magnetic element section 9 is accommodated. The first molded part section 11 and the second molded part section 12 are connected to each other by means of a hinge 13.

As shown in FIGS. 1 and 2, the hinge 13 can be designed as a thin-walled web connecting the first molded part section 11 with the second molded part section 12 in one piece, in particular in one piece of material. The hinge 13 is resiliently deformable. In the present case, "one piece" means that the first molded part section 11, the second molded part section 12 and the hinge 13 form a single-piece component which is made of the same material throughout. With the aid of the hinge 13, the plastic molded part 10 can be moved from an open state as shown in FIGS. 1 and 2, in which the cable strand 2 with the corrugated tube 5A and/or the corrugated tube 5B can be inserted into the plastic molded part 10, to a closed state not shown, in which the plastic molded part 10 encloses the cable strand 2 or the corrugated tube 5A and/or the corrugated tube 5B.

The plastic molded part 10 comprises a cable guiding section 14 for guiding the cable strand 2. Two such cable guiding sections 14, 15 are provided, in particular a first cable guiding section 14 and a second cable guiding section 15, between which the magnetic element 7 is positioned. The cable guiding sections 14, 15 extend along the longitudinal direction L and can thus guide the cable strand 2 along the longitudinal direction L. The cable guiding sections 14, 15 have the previously mentioned engagement elements or engagement sections which are suitable for a form-locking engagement in the troughs of the corrugated tubes 5A, 5B. The engagement elements or engagement sections can be rib-shaped.

Each cable guiding section 14 and 15 is in turn divided into two semi-cylindrical half-shells 16, 17 and 18, 19 respectively. The cable guiding sections 14, 15 are thus tubular when the plastic molded part 10 is closed. An annular groove 20 (FIG. 2) can be provided on the second cable guiding section 15, which completely surrounds it. The cable guiding sections 14, 15 and the half-shells 16, 18 each have snap hooks or latching hooks 21, of which only one is provided with a reference sign in FIGS. 1 and 2.

The latching hooks 21 are designed to snap into corresponding recesses 22 of the respective cable guiding section 14, 15 or the half-shell 17, 19 in a form-locking manner. In FIGS. 1 and 2, only one recess 22 is provided with a reference sign. A form-locking connection is created by engaging at least two connecting partners, in this case the latching hooks 21 and the recesses 22, into each other or behind each other. With the help of the latching hooks 21 and the recesses 22, the first molded part section 11 and the second molded part section 12 can thus be connected to each other in a form-locking manner.

The plastic molded part 10 also includes a receiving section 23 for receiving the magnetic element 7. Like the cable guiding sections 14, 15, the receiving section 23 is divided into two half-shells 24, 25. The receiving section 23 is located between the two cable guiding sections 14, 15. The receiving section 23 is designed in one piece, in particular in one piece of material, with the two cable guiding sections 14, 15. In particular, the half-shells 16, 18, 25 and the half-shells 17, 19, 24 are connected to each other in one piece, in particular in one piece of material. The receiving section 23 is thus tubular when the plastic molded part 10 is closed.

The receiving section 23 preferably comprises a large number of snap hooks or latching hooks 26, of which only one is provided with a reference sign in FIG. 1. For example, two such latching hooks 26 are assigned to each of the two half-shells 24, 25. With the aid of the latching hooks 26, the magnetic element sections 8, 9 can be attached in the receiving section 23 in a form-locking manner. In other words, to produce the cable receiving device 6, the magnetic element 7 in the form of the two magnetic element sections 8, 9 is pressed into the two half-shells 24, 25 of the receiving section 23, whereby the latching hooks 26 are deformed in a spring-elastic manner and engage or embrace the magnetic element sections 8, 9 in a form-locking manner. With the aid of the receiving section 23, a defined position of the magnetic element 7 in or on the cable harness 1 is thus always guaranteed. The magnetic element 7 can thus be used specifically to absorb electromagnetic radiation.

Alternatively, the magnetic element 7 can also be bonded to the receiving section 23. In this case, the magnetic element sections 8, 9 can be glued into the receiving section 23, for example. Furthermore, the magnetic element 7 or the magnetic element sections 8, 9 can also be insert molded or over-molded with material of the plastic molded part 10 in a plastic injection molding process. Furthermore, the cable receiving device 6 can also be manufactured using a multi-component injection molding process. In this case, a thermoplastic used to produce the plastic molded part 10 and a composition, in particular a so-called compound, comprising a thermoplastic and a ferrite powder, in particular a hard ferrite powder, are used in an injection mold to produce the magnetic element 7. The magnetic element 7 can then still be magnetized in the injection mold as long as the thermoplastic has not yet solidified and the ferrite powder can be aligned in a magnetic field.

In such a multi-component injection molding process, the mold is first filled in the closed injection mold with a cavity that forms the magnetic element 7 and then a cavity that forms the plastic molded part 10. The plastic molded part 10 can thus be formed in one piece with the magnetic element 7. The cable receiving device 6 thus has a defined partial area for the absorption of electromagnetic radiation, namely the magnetic element 7, after it has been removed from the injection mold, and another partial area, namely the plastic molded part 10, consists only of the thermoplastic material used to produce the plastic molded part 10.

Figure 3:
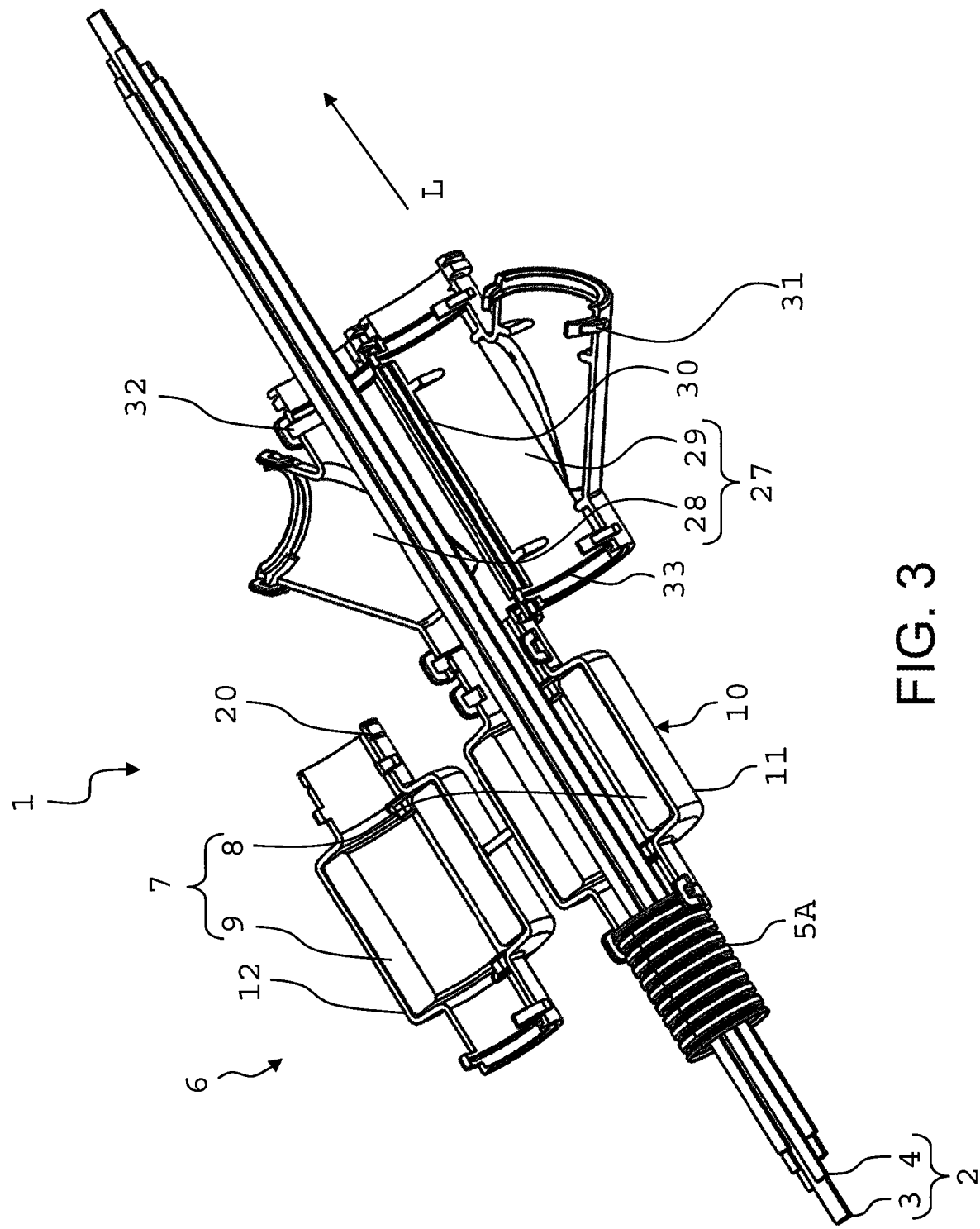
FIG. 3 shows a schematic perspective view of another embodiment of a cable harness.
Figure 4:
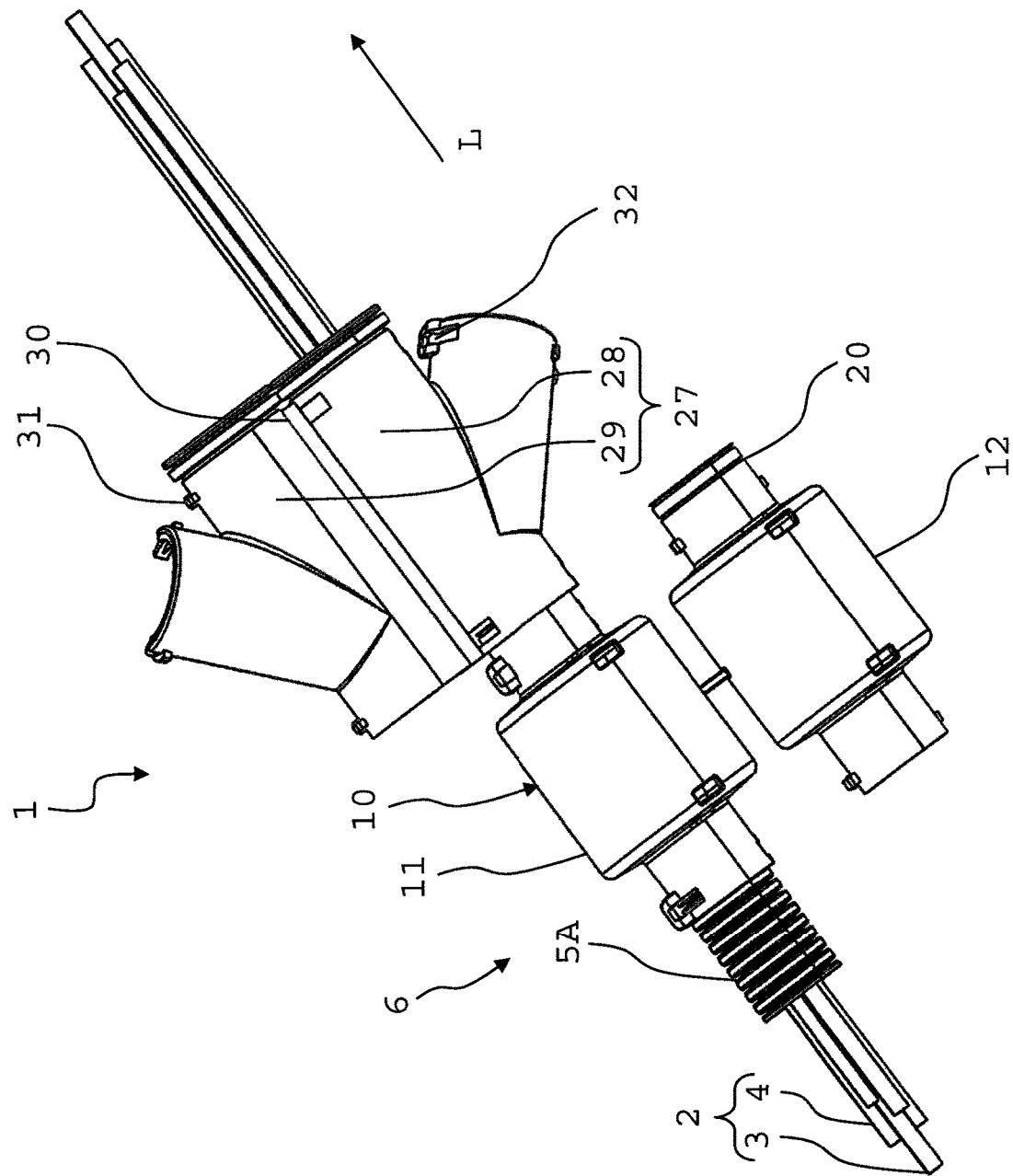
FIG. 4 shows another schematic perspective view of the cable harness as shown in FIG. 3.

FIGS. 3 and 4 each show a schematic perspective view of another embodiment of a cable harness 1. The embodiment of the cable harness 1 according to FIGS. 3 and 4 differs from the embodiment of the cable harness 1 according to FIGS. 1 and 2 only in that a second plastic molded part 27 is provided in addition to the first plastic molded part 10.

The second plastic molded part 27 is in particular a so-called Y-distributor. With the help of the second plastic molded part 27, the cable strand 2 can be split up, for example, into several corrugated tubes 5A, 5B. The second plastic molded part 27 comprises a first half-shell 28 and a second half-shell 29, which are pivotably connected to each other by means of a hinge 30. The second half-shell 29 is provided with a large number of snap hooks or latching hooks 31, which are designed to engage in corresponding recesses 32 of the first half-shell 28 in a form-locking manner. Furthermore, the plastic molded part 27 comprises an annular engagement section 33 provided on the two half-shells 28, 29, which is designed to engage in the annular groove 20 provided on the second cable guiding section 15 in a form-locking manner. In this way, the second plastic molded part 27 and the first plastic molded part 10 can be connected to each other in a form-locking manner.

Figure 5:
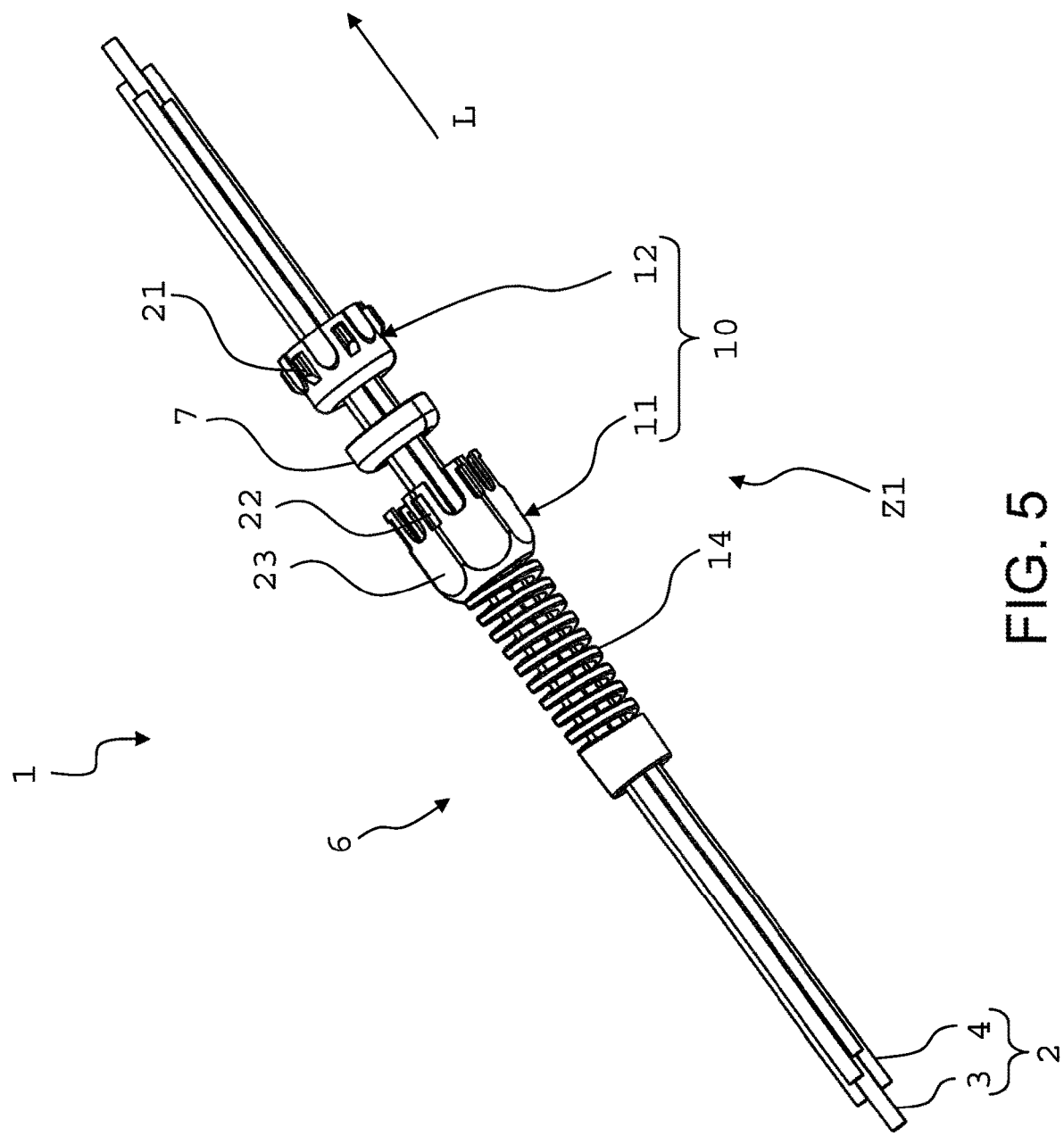
FIG. 5 shows a schematic perspective view of another embodiment of a cable harness.
Figure 6:
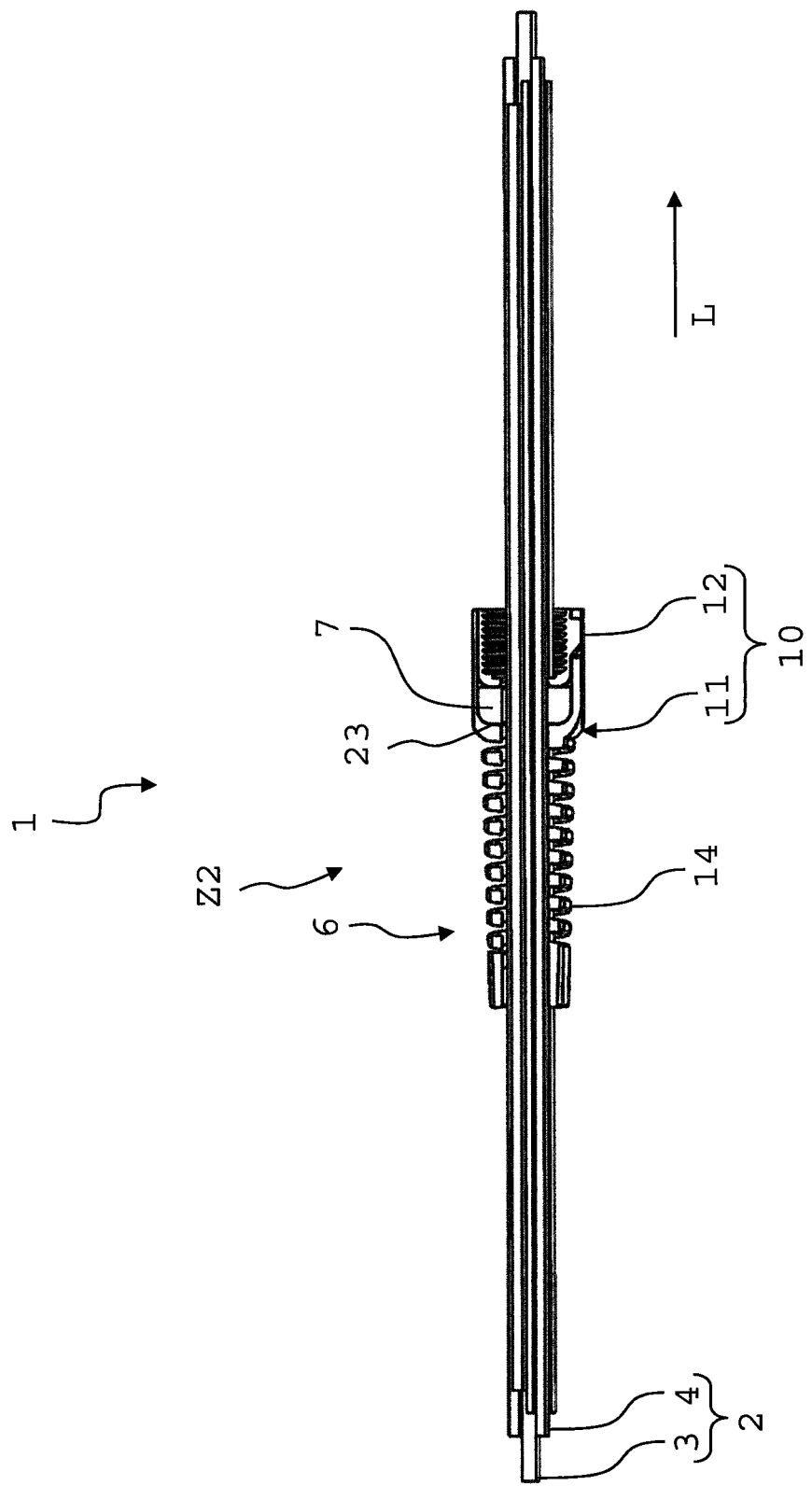
FIG. 6 shows a schematic sectional view of the cable harness as shown in FIG. 5.

FIGS. 5 and 6 show a schematic perspective view and a sectional view, respectively, of another embodiment of a cable harness 1 with another version of a cable receiving device 6. In this embodiment of the cable harness 1, the cable receiving device 6 is designed as a cap nut arrangement. The cable receiving device 6 comprises a first molded part section 11, which is designed as an anti-kink module for the cable strand 2, and a second molded part section 12, which is designed as a cap nut. This means that in this case the plastic molded part 10 is designed in two parts.

A magnetic element 7 in the form of a closed ring-shaped body is inserted between the first molded part section 11 and the second molded part section 12. The cable strand 2 is passed through the first molded part section 11, the magnetic element 7 and the second molded part section 12. The first molded part section 11 comprises a cable guiding section 14 in the form of a spring which is resiliently deformable and prevents the cable strand 2 from kinking when it is bent. The cable guiding section 14 guides the cable strand 2 along its longitudinal direction L.

The second molded part section 12 comprises a variety of snap hooks or latching hooks 21, which are designed to snap into corresponding recesses 22 of the first molded part section 11. To produce the cable receiving device 6, the magnetic element 7 is thus inserted into a receiving section 23 provided on the first molded part section 11, and the second molded part section 12 is snapped into the first molded part section 11 by means of the latching hooks 21 and the recesses 22. Thus, the cable receiving device 6 can be moved from an open state Z1 (FIG. 5) to a closed state Z2 (FIG. 6) by pushing the second molded part section 12 onto the first molded part section 11.

Figure 7:
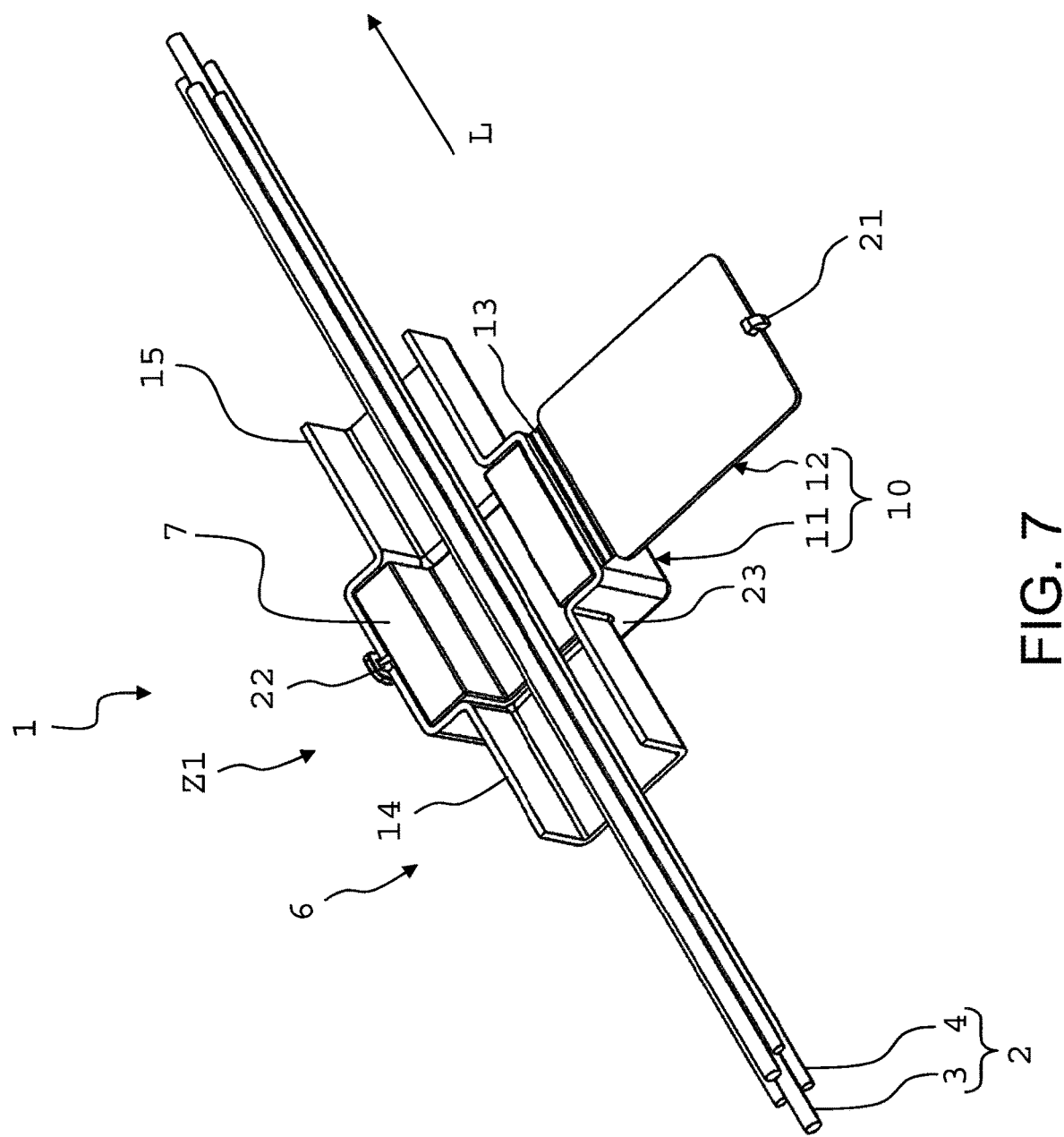
FIG. 7 shows a schematic perspective view of another embodiment of a cable harness.
Figure 8:
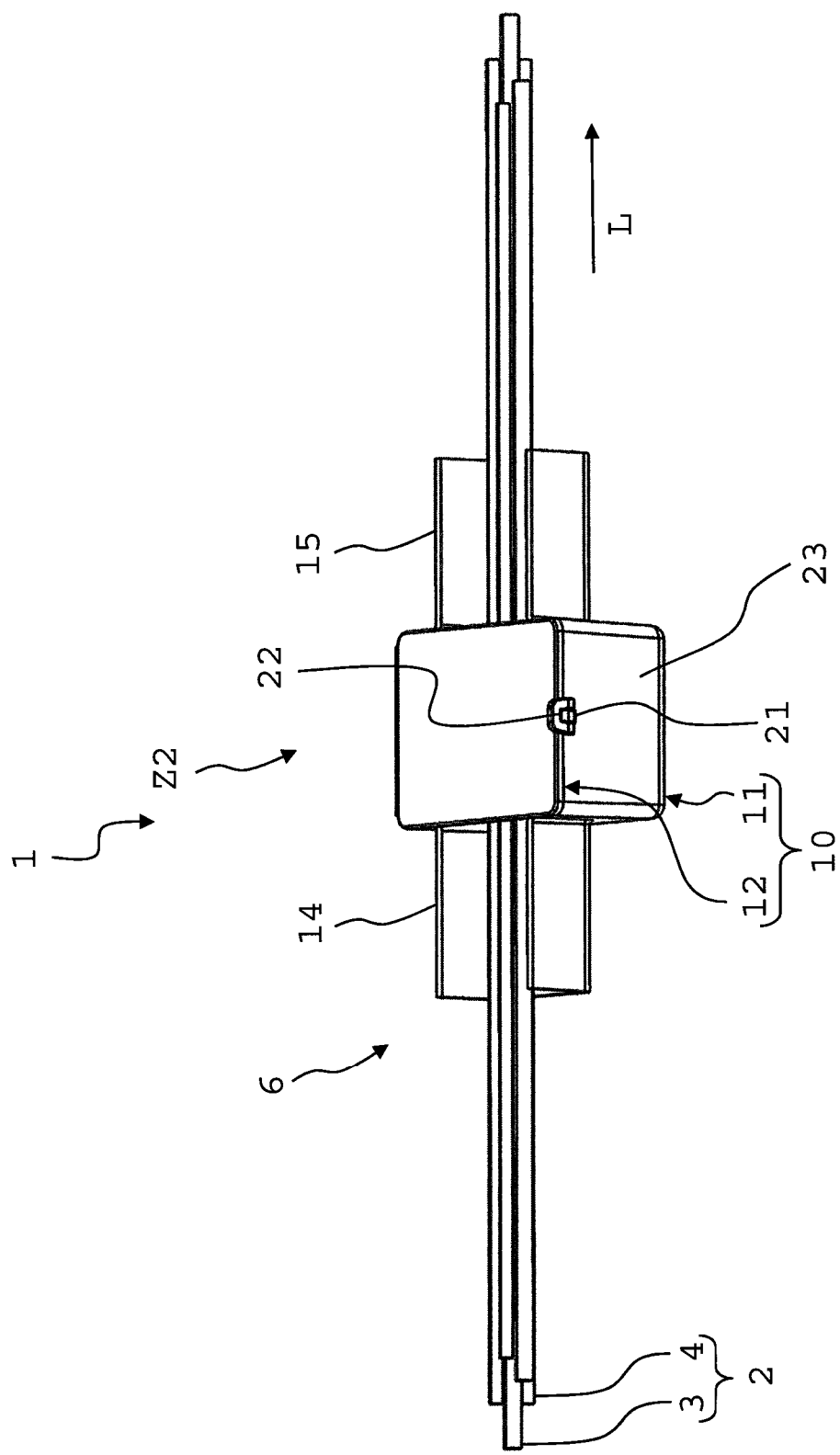
FIG. 8 shows another schematic perspective view of the cable harness as shown in FIG. 7.

FIGS. 7 and 8 each show a schematic perspective view of another embodiment of a cable harness 1 with another embodiment of a cable receiving device 6. In this embodiment, the cable receiving device 6 comprises a U-shaped or C-shaped magnetic element 7 and a plastic molded part 10 with a first cable guiding section 14 and a second cable guiding section 15. Furthermore, the plastic molded part 10 comprises a first molded part section 11, to which the cable guiding sections 14, 15 are assigned, as well as a second molded part section 12. The cable guiding sections 14, 15 are not tubular but trough-shaped. This means that the cable guiding sections 14, 15 are open at the top in the orientation shown in FIGS. 7 and 8. The cable guiding sections 14, 15 guide the cable strand 2 along its longitudinal direction L.

Between the two cable guiding sections 14, 15, a receiving section 23 is provided for the magnetic element 7. However, the receiving section 23 is only formed in the first molded part section 11 and not in the second molded part section 12 of the plastic molded part 10. This means that the first molded part section 11 comprises the cable guiding sections 14, 15 and the receiving section 23, while the second molded part section 12 is hinged to the first molded part section 11 by means of a hinge 13, especially a film hinge. The second molded part section 12 is plate-shaped. The receiving section 23 can be box-shaped or cuboid. The receiving section 23 can also have snap-in hooks that are not shown, which can be used to fasten the magnetic element 7 into the receiving section 23 in a form-locking manner.

To produce the cable harness 1, the cable strand 2 can be inserted into the opened plastic molded part 10. Then the plastic molded part 10 is moved from its open state Z1 (FIG. 7) to its closed state Z2 (FIG. 8). For this purpose, the second molded part section 12 is swiveled relative to the first molded part section 11 by means of the hinge 13. A latching hook 21 of the second molded part section 12 engages in a recess 22 provided on the receiving section 23, whereby the molded part sections 11, 12 are connected to each other in a form-locking manner.

Figure 9:
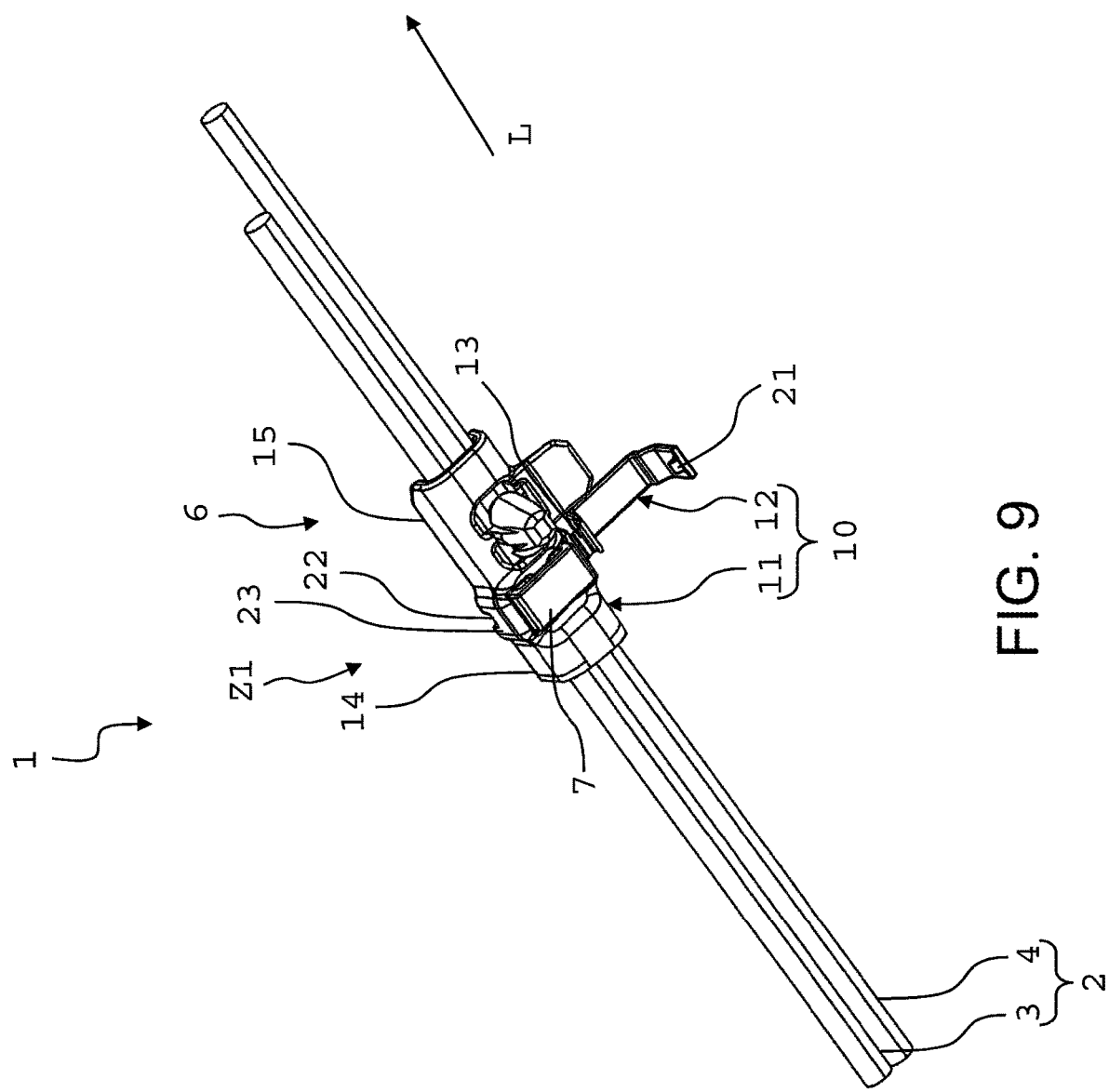
FIG. 9 shows a schematic perspective view of another embodiment of a cable harness.
Figure 10:
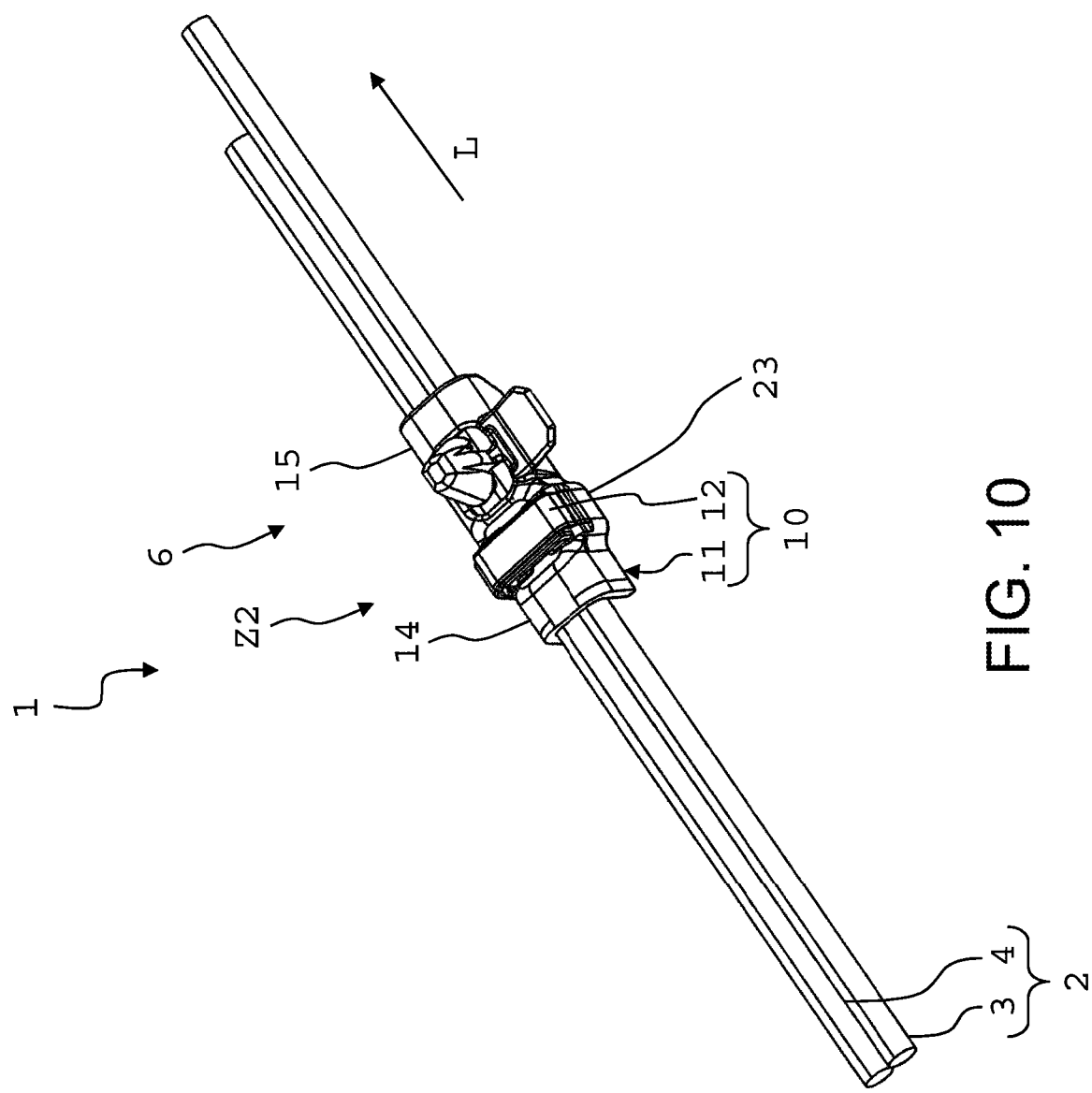
FIG. 10 shows another schematic perspective view of the cable harness as shown in FIG. 9.
Figure 11:
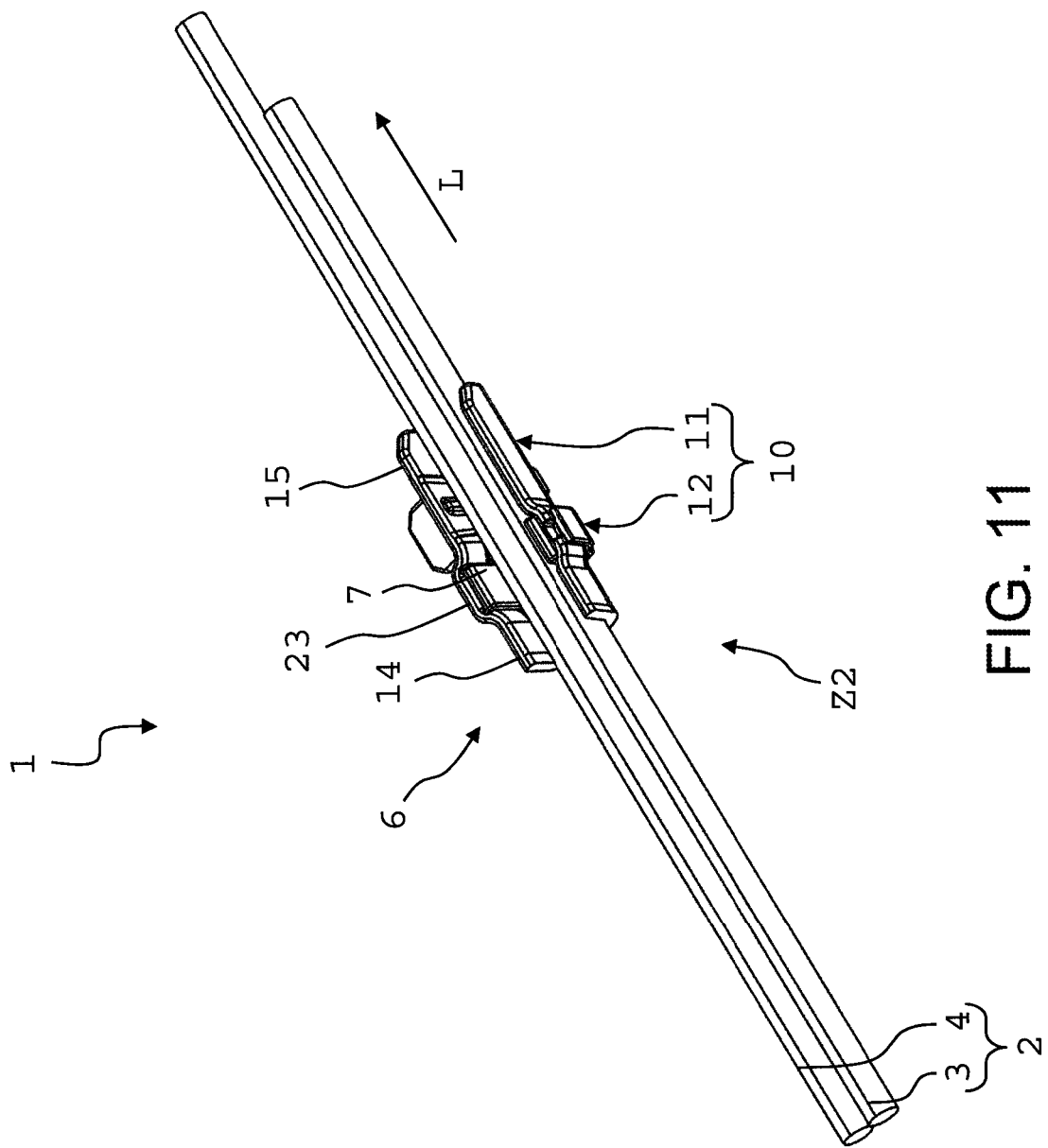
FIG. 11 shows another schematic perspective view of the cable harness as shown in FIG. 9.
Figure 12:
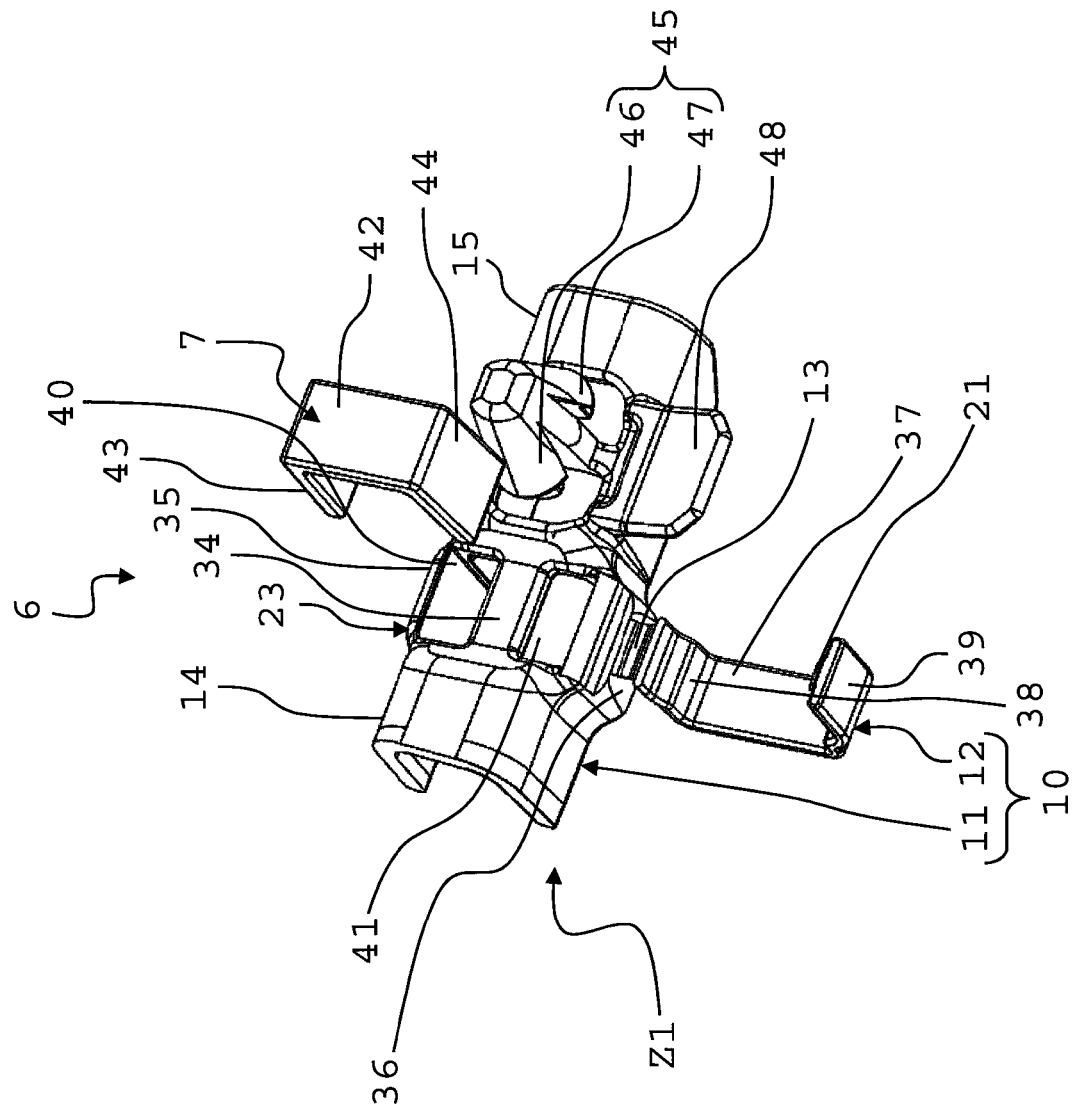
FIG. 12 shows a schematic perspective view of an embodiment of a cable receiving device for the cable harness as shown in FIG. 9.

FIGS. 9 to 11 each show a schematic perspective view of a further embodiment of a cable harness 1 with a further embodiment of a cable receiving device 6. FIG. 12 shows a schematic perspective view of the cable receiving device 6 for the cable harness 1 according to FIGS. 9 to 11.

In this embodiment of the cable receiving device 6, a one-piece magnetic element 7 is provided, which has a C-shaped or U-shaped geometry. The cable receiving device 6 itself is designed as a fastening device that is set up, for example, to fasten the cable strand 2 to a body component. A plastic molded part 10 of the cable receiving device 6 comprises a first molded part section 11 and a second molded part section 12, which are pivotably connected to each other by means of a hinge 13. A latching hook 21 is provided on the second molded part section 12, which is designed to latch into a recess 22 provided on the first molded part section 11 in a form-locking manner. This allows the cable receiving device 6 to be moved from an open state Z1 (FIGS. 9 and 12) to a closed state Z2 (FIGS. 10 and 11).

The first molded part section 11 comprises a first cable guiding section 14 and a second cable guiding section 15, which are designed in the form of a channel. This means that in the upward orientation of FIG. 11, the cable guiding sections 14, 15 are open. The cable guiding sections 14, 15 guide the cable strand 2 along its longitudinal direction L.

Between the cable guiding sections 14, 15, a box-shaped receiving section 23 is provided for receiving the magnetic element 7. The receiving section 23 is also channel-shaped, that is the receiving section 23 is open at the top in the orientation shown in FIG. 11. The first molded part section 11 is U-shaped or C-shaped at least in the area of the receiving section 23. This means that the first molded part section 11 has a bottom 34 in the area of the receiving section 23 and two side walls 35, 36 spaced apart from and parallel to each other (FIG. 12).

The second molded part section 12 is also U-shaped or C-shaped in cross-section. The second molded part section 12 comprises a bottom 37 and two side walls 38, 39 arranged parallel to and spaced apart from each other (FIG. 12). In the closed state Z2 (FIGS. 10 and 11), the first molded part section 11 and the second molded part section 12 are arranged inside each other. The magnetic element 7 is positioned between the first molded part section 11 and the second molded part section 12. The magnetic element 7 is partially positioned outside the first molded part section 11. In particular, the magnetic element 7 is passed through two breakthroughs 40, 41 (FIG. 12) provided in the bottom 34 of the receiving section 23. Accordingly, the magnetic element 7 also has a bottom 42 and two side walls 43, 44 spaced apart from and parallel to each other. The bottom 42 of the magnetic element 7 is located between the bottom 34 of the receiving section 23 and the bottom 37 of the second molded part section 12.

A mushroom-shaped fastening element 45 is also provided on the second cable guiding section 15. With the help of the fastening element 45, the cable receiving device 6 can, as mentioned above, be attached to a vehicle body component, for example. The fastening element 45 comprises two elastically deformable snap-in hooks or latching hooks 46, 47. Furthermore, an actuating element 48 is also provided on the second cable guiding section 15. With the help of the plate-shaped actuating element 48, the fastening element 45 can be pressed into a hole, for example.

Figure 13:
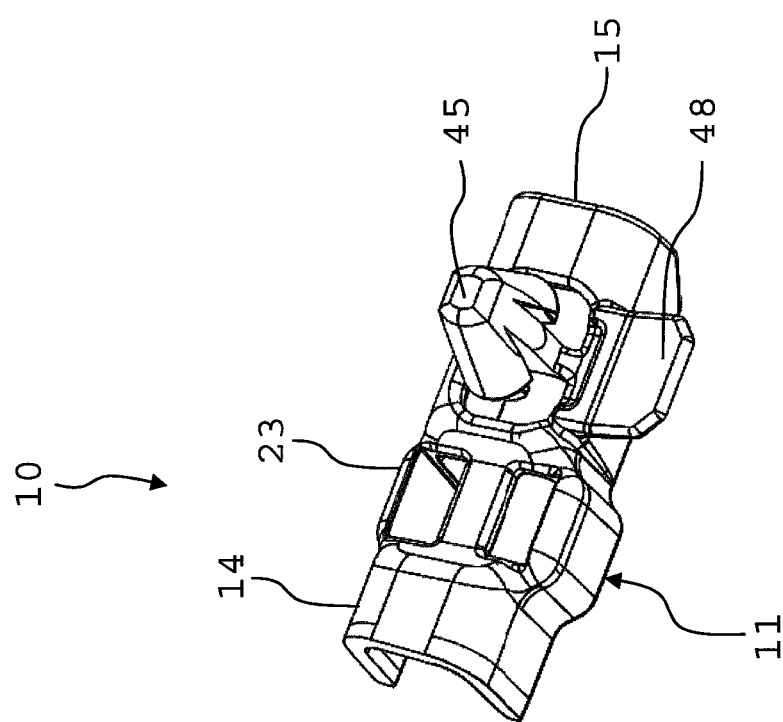
FIG. 13 shows a schematic perspective view of an embodiment of a plastic molded part for the cable harness according to FIG. 9.

FIG. 13 shows a schematic perspective view of another embodiment of a plastic molded part 10 of a cable receiving device 6 for the cable harness 1 according to FIGS. 9 to 11, which is not shown in FIG. 13. This embodiment of the plastic molded part 10 according to FIG. 13 differs from the plastic molded part 10 according to FIG. 12 in that no two molded part sections 11, 12 are provided. Instead, the plastic molded part 10 comprises only one molded part section 11, that is the plastic molded part 10 is designed in one piece without a hinge 13. The magnetic element 7 (not shown in FIG. 13) is accommodated in the plastic molded part 10. For example, the magnetic element 7 is glued to the plastic molded part 10. Alternatively, snap-in hooks not shown may be provided to connect the magnetic element 7 to the plastic molded part in a form-locking manner.

Figure 14:
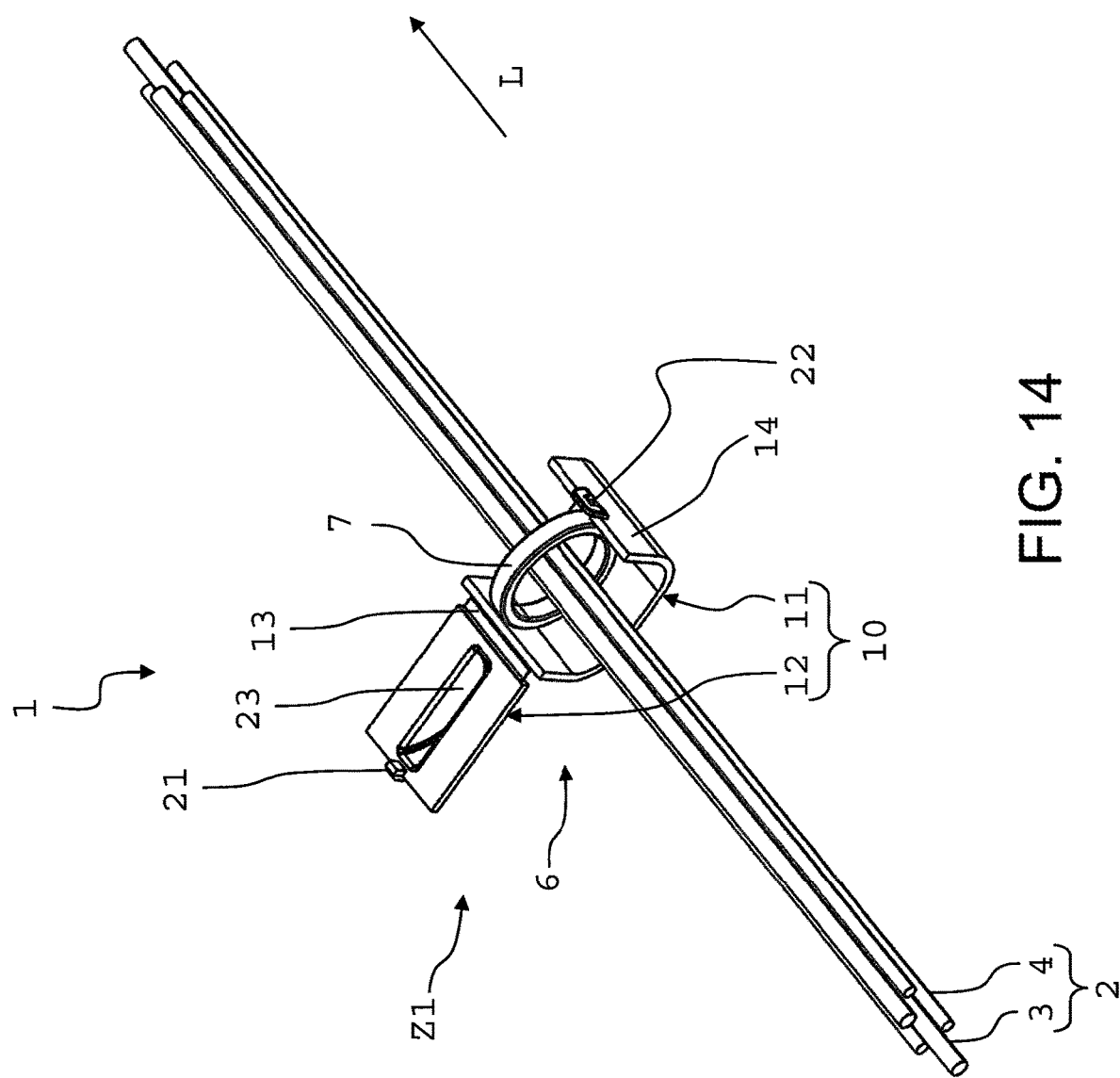
FIG. 14 shows a schematic perspective view of another embodiment of a cable harness.
Figure 15:
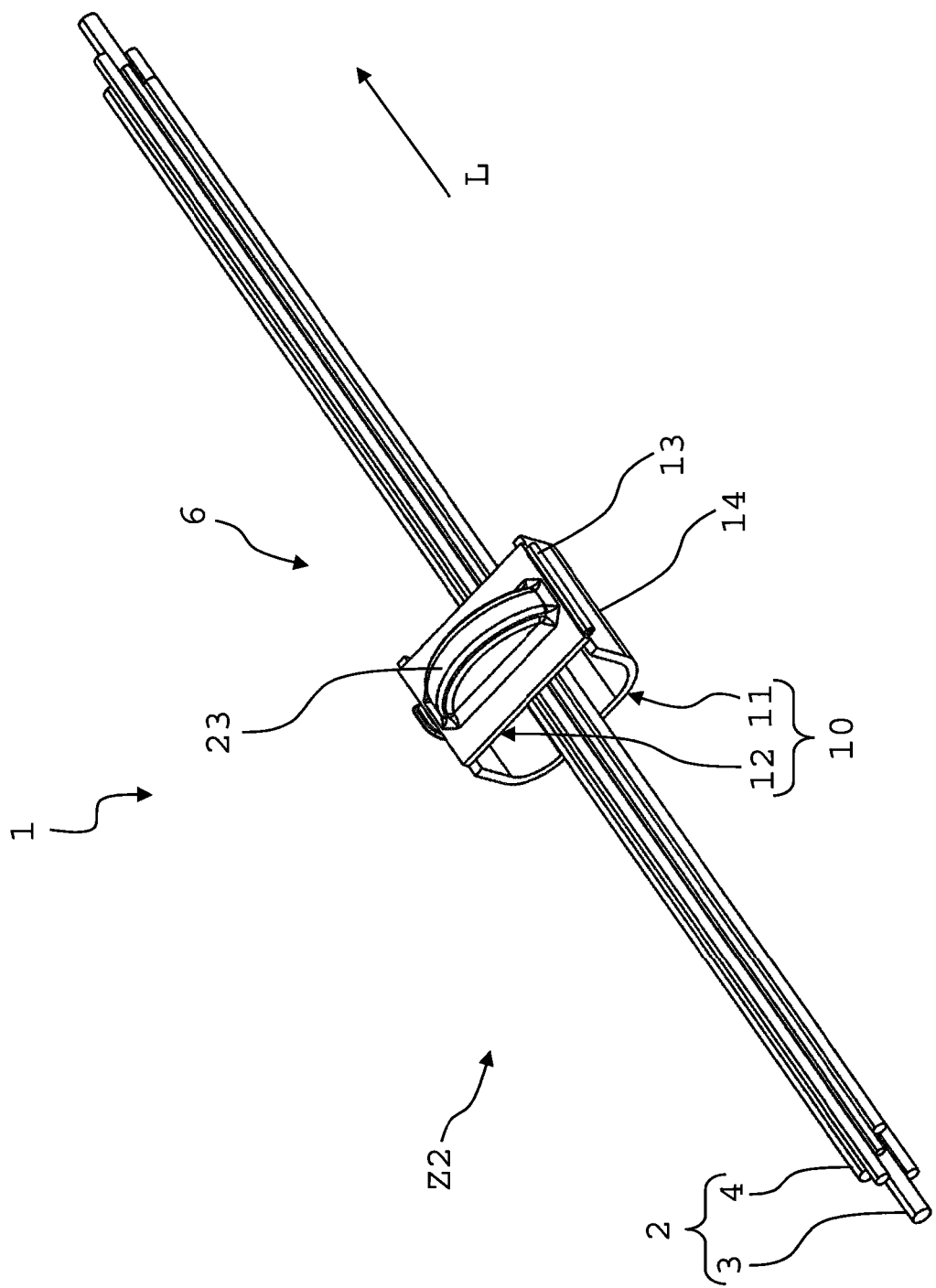
FIG. 15 shows another schematic perspective view of the cable harness as shown in FIG. 14.

FIGS. 14 and 15 each show a schematic perspective view of a further embodiment of a cable harness 1 with a further embodiment of a cable receiving device 6. This embodiment of the cable receiving device 6 has a magnetic element 7 in the form of a ring-shaped body through which the cable strand 2 is passed. A plastic molded part 10 of the cable receiving device 6 again comprises a first molded part section 11 and a second molded part section 12, which are pivotably connected to each other by means of a hinge 13.

In this embodiment of the plastic molded part 10, the first molded part section 11 comprises a cable guiding section 14, which is C-shaped or U-shaped in cross section and with the aid of which the cable strand 2 is guided along its longitudinal direction L. The cable guiding section 14 is channel-shaped and closed at the top by means of the second molded part section 12, which is particularly plate-shaped (FIG. 15).

The second molded part section 12 comprises a receiving section 23 for partially receiving the magnetic element 7. The receiving section 23 is partially disc-shaped and extends upward from the plate-shaped second molded part section 12 in the orientation shown in FIG. 15. Using the hinge 13, the cable receiving device 6 can be moved from an open state Z1 (FIG. 14) to a closed state Z2 (FIG. 15). For this purpose, the first molded part section 11 is provided with a recess 22, into which a latching hook 21 of the second molded part section 12 can engage in a form-locking manner.

Figure 16:
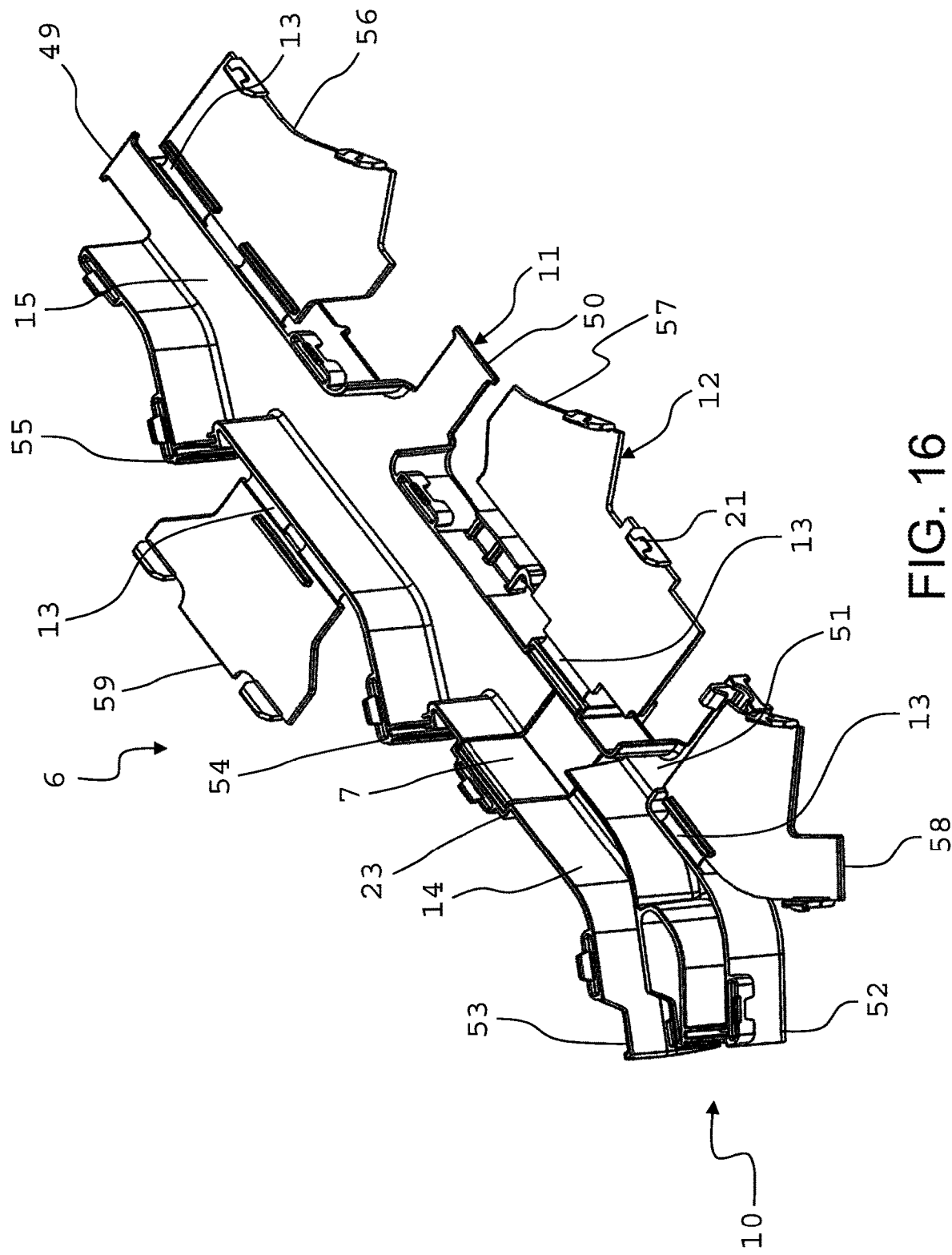
FIG. 16 shows a schematic perspective view of an embodiment of a cable receiving device.
Figure 17:
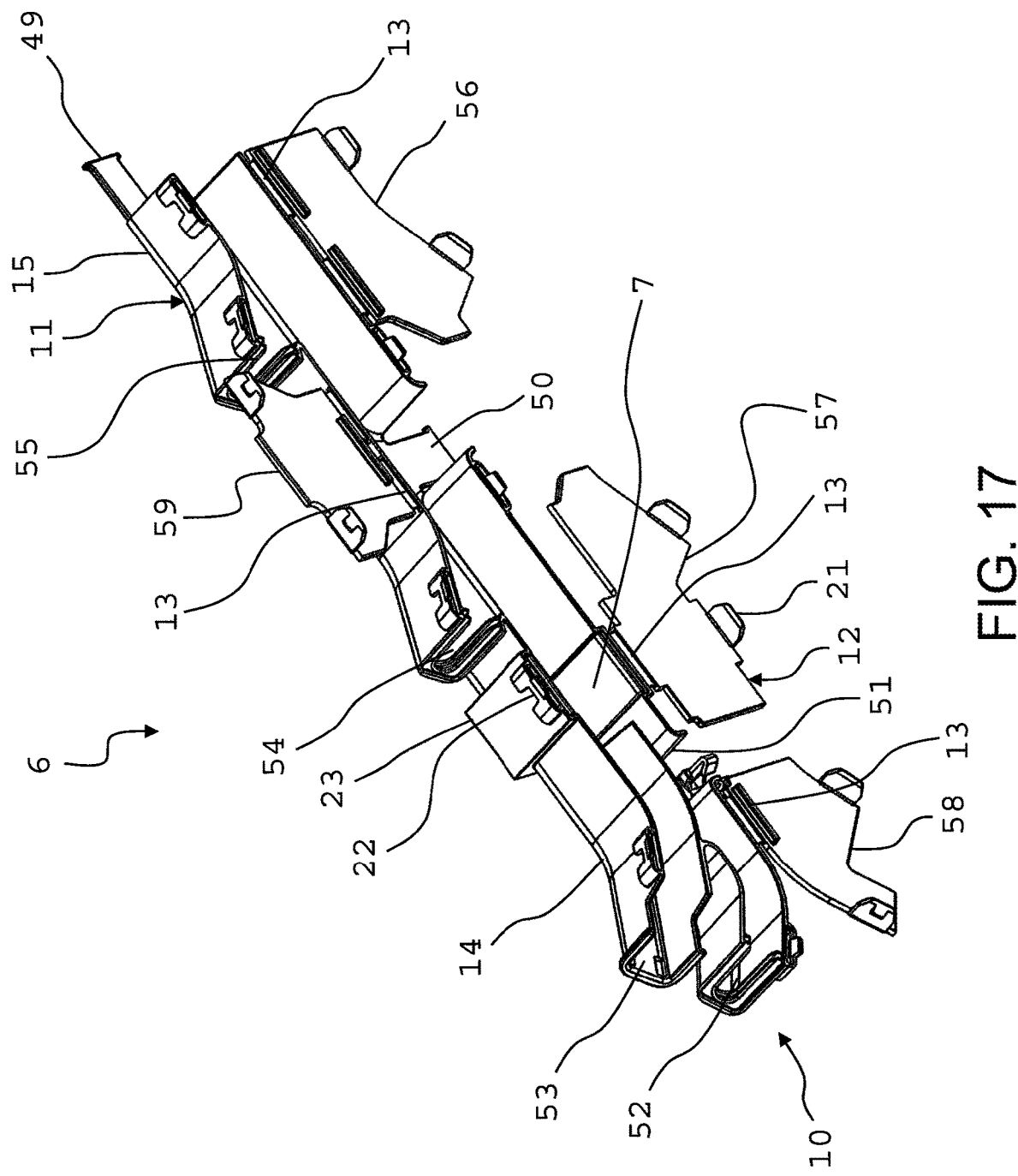
FIG. 17 shows another schematic perspective view of the cable receiving device as shown in FIG. 16.
Figure 18:
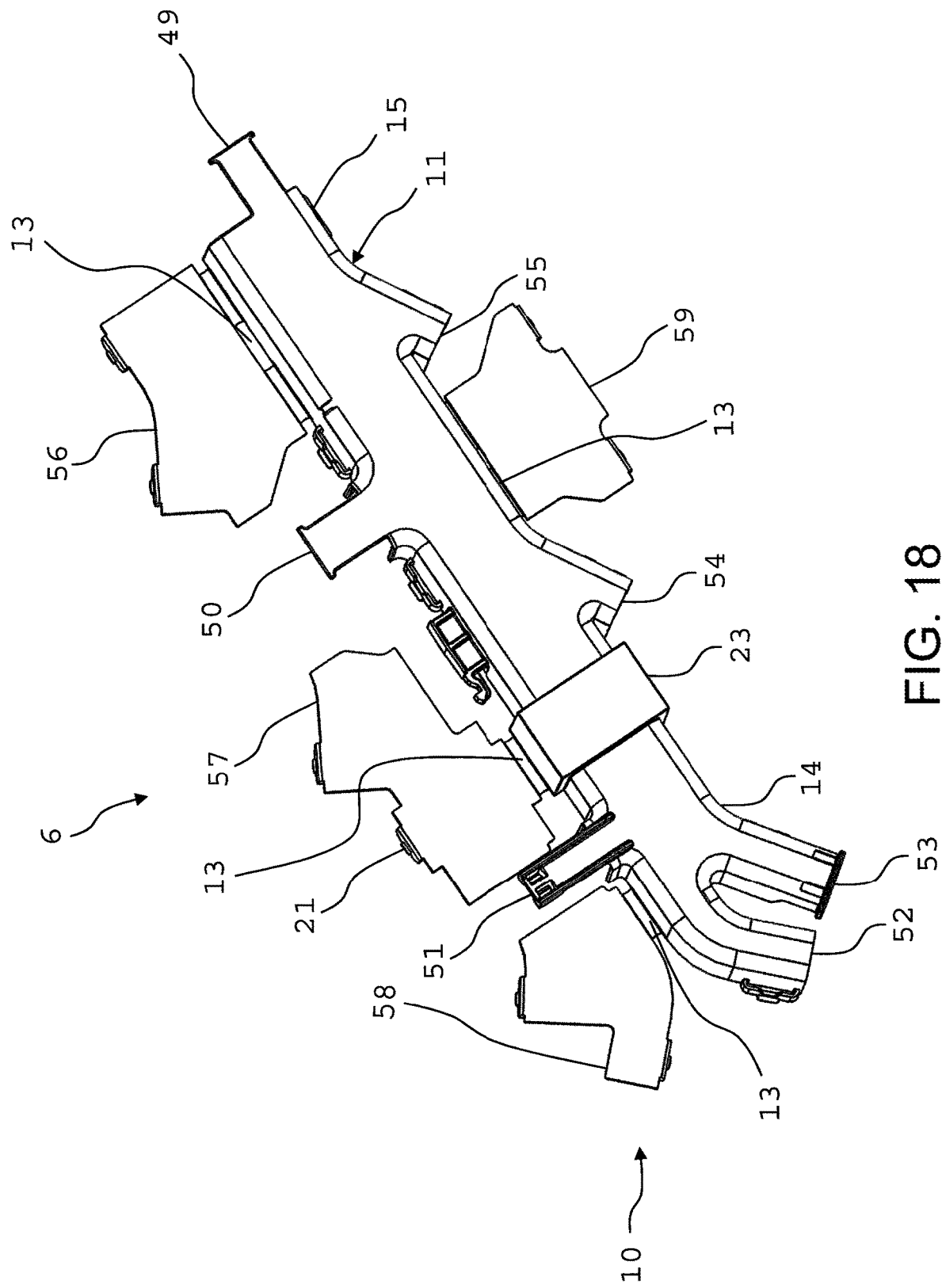
FIG. 18 shows another schematic perspective view of the cable receiving device as shown in FIG. 16.

FIGS. 16 to 18 each show a schematic perspective view of another embodiment of a cable receiving device 6 for a cable harness 1 as explained above. In this case, the cable receiving device 6 is designed as cable duct or cable shaft. The cable receiving device 6 comprises a C-shaped or U-shaped magnetic element 7 and a plastic molded part 10, which in turn comprises a channel-shaped first molded part section 11, which comprises a multitude of inlets and/or outlets 49 to 55. Via the inlets and/or outlets 49 to 55, the cables 3, 4 of the cable strand 2 can be fed into the first molded part section 11 and individual cables 3, 4 can be fed out again laterally from the first molded part section 11.

The plastic molded part 10 further comprises a second molded part section 12, which is divided into a number of covers 56 to 59, each of which is pivotally connected to the first molded part section 11 by means of a hinge 13. The covers 56 to 59 comprise latching hooks 21, of which only one is provided with a reference sign in FIGS. 16 to 18. The latching hooks 21 are designed to engage or snap into corresponding recesses 22 of the first molded part section 11.

The first molded part section 11 further comprises two cable guiding sections 14, 15 between which a box-shaped receiving section 23 for the magnetic element 7 is arranged. With the help of the cable guiding sections 14, 15 the not shown cable strand 2 is guided along its longitudinal direction L. The receiving section 23 is provided as a cuboid extension between the cable guiding sections 14, 15. The magnetic element 7 can be connected to the receiving section 23 in a form-locking manner by means of snap-in hooks which are not shown, but which have been explained above.

Figure 19:
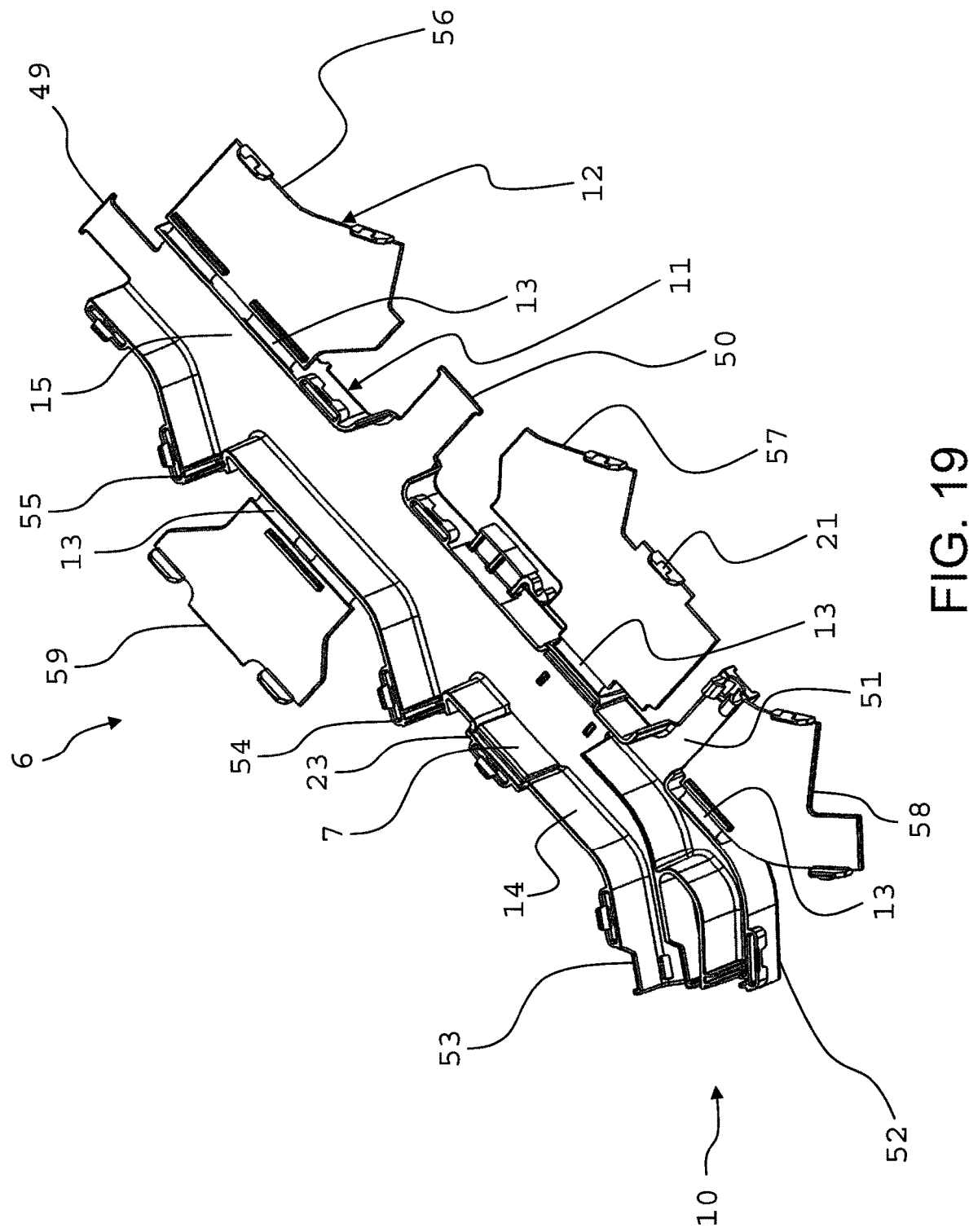
FIG. 19 shows a schematic perspective view of another embodiment of a cable receiving device.
Figure 20:
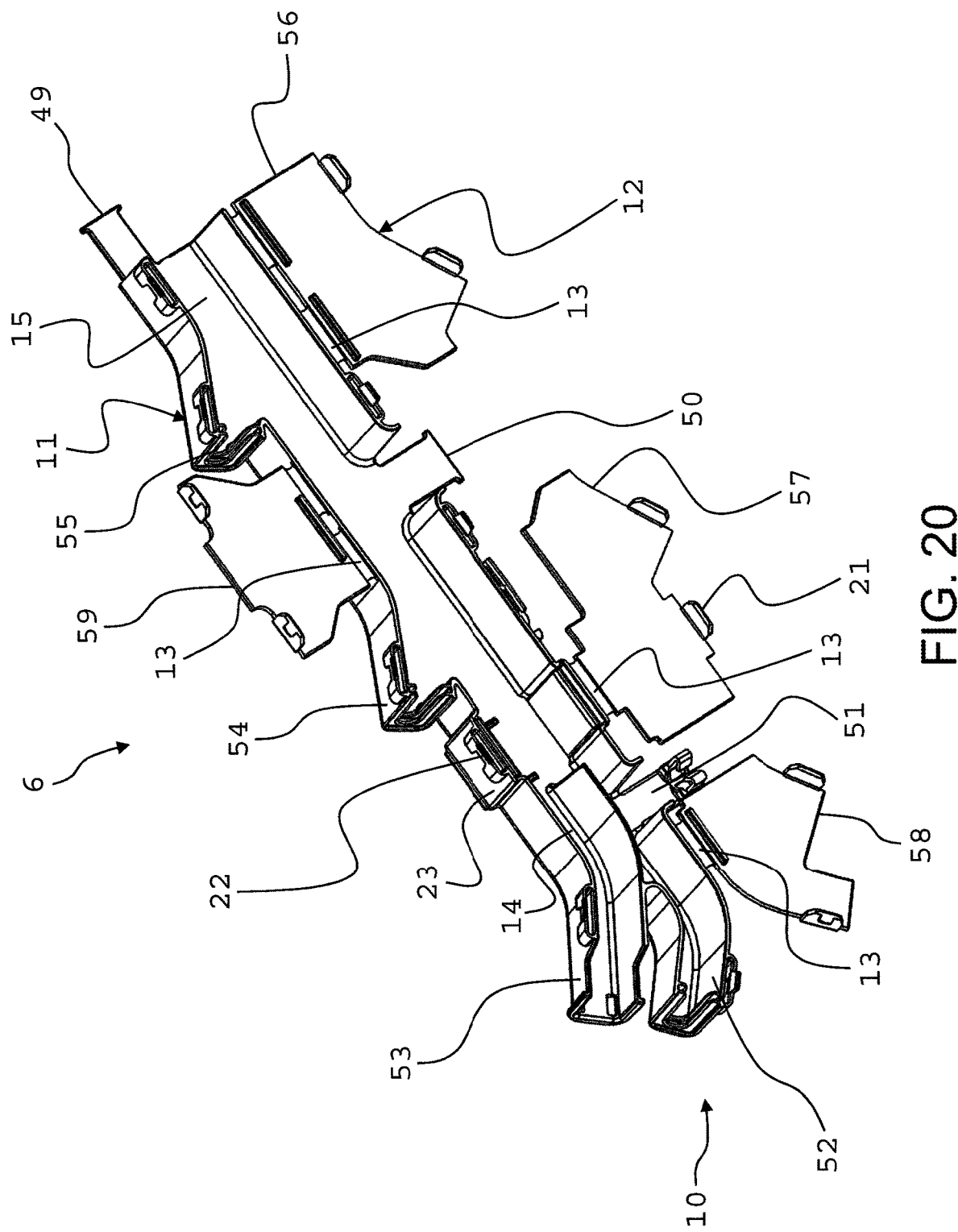
FIG. 20 shows another schematic perspective view of the cable receiving device as shown in FIG. 19.
Figure 21:
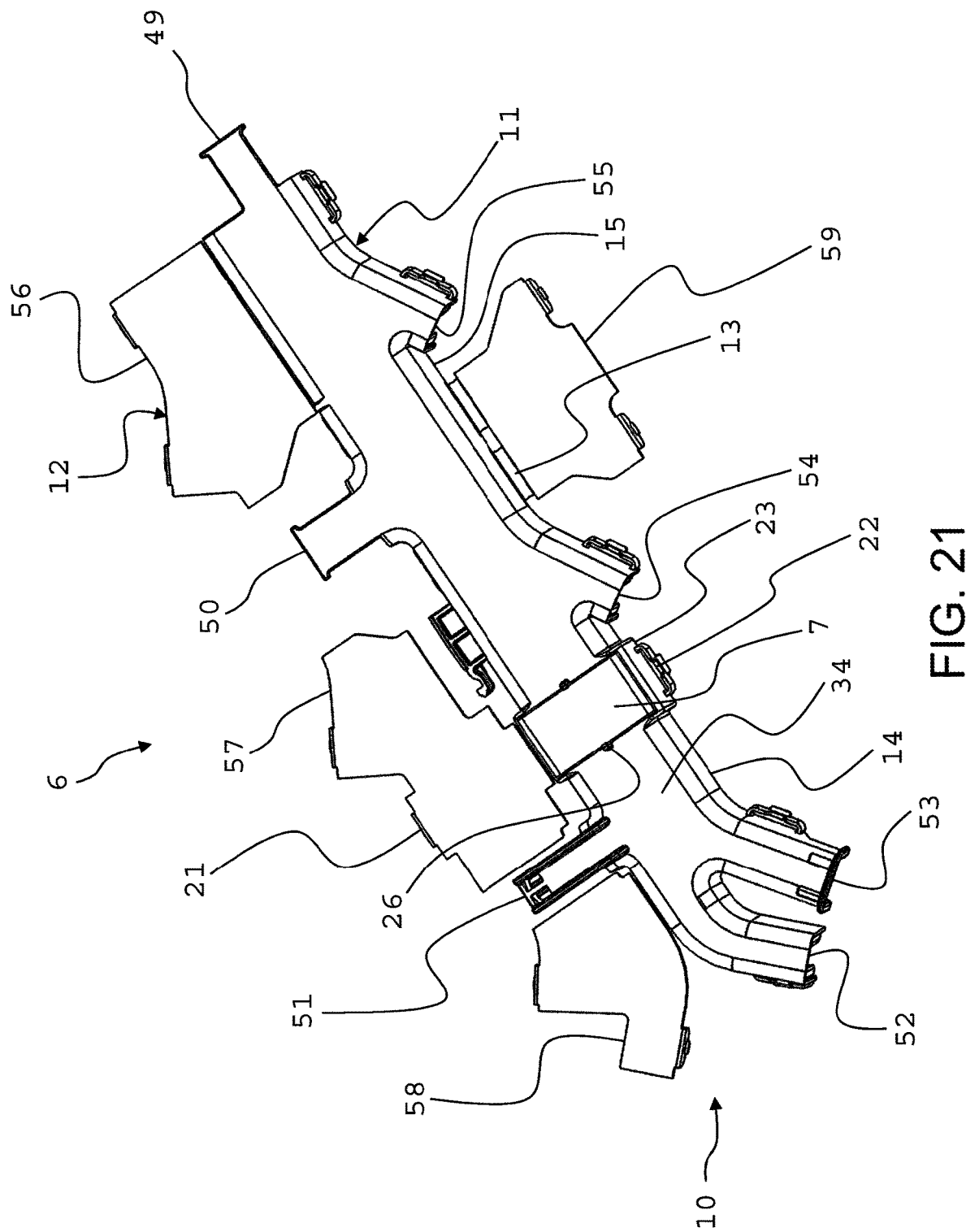
FIG. 21 shows another schematic perspective view of the cable receiving device as shown in FIG. 19.

FIGS. 19 to 21 each show a schematic perspective view of a further embodiment of a cable receiving device 6 for a cable harness 1 as explained above. The cable receiving device 6 according to FIGS. 19 to 21 differs from the cable receiving device 6 according to FIGS. 16 to 18 only by an alternative design of the receiving section 23. In this embodiment of the cable receiving device 6, the U-shaped magnetic element 7 is arranged partly outside and partly inside the first molded part section 11. In particular, latching hooks 26 are provided on a bottom 34 of the first molded part section 11 as already explained above, which engage around the magnetic element 7 at least in sections in a form-locking manner in order to connect the magnetic element 7 to the plastic molded part 10.

Figure 22:
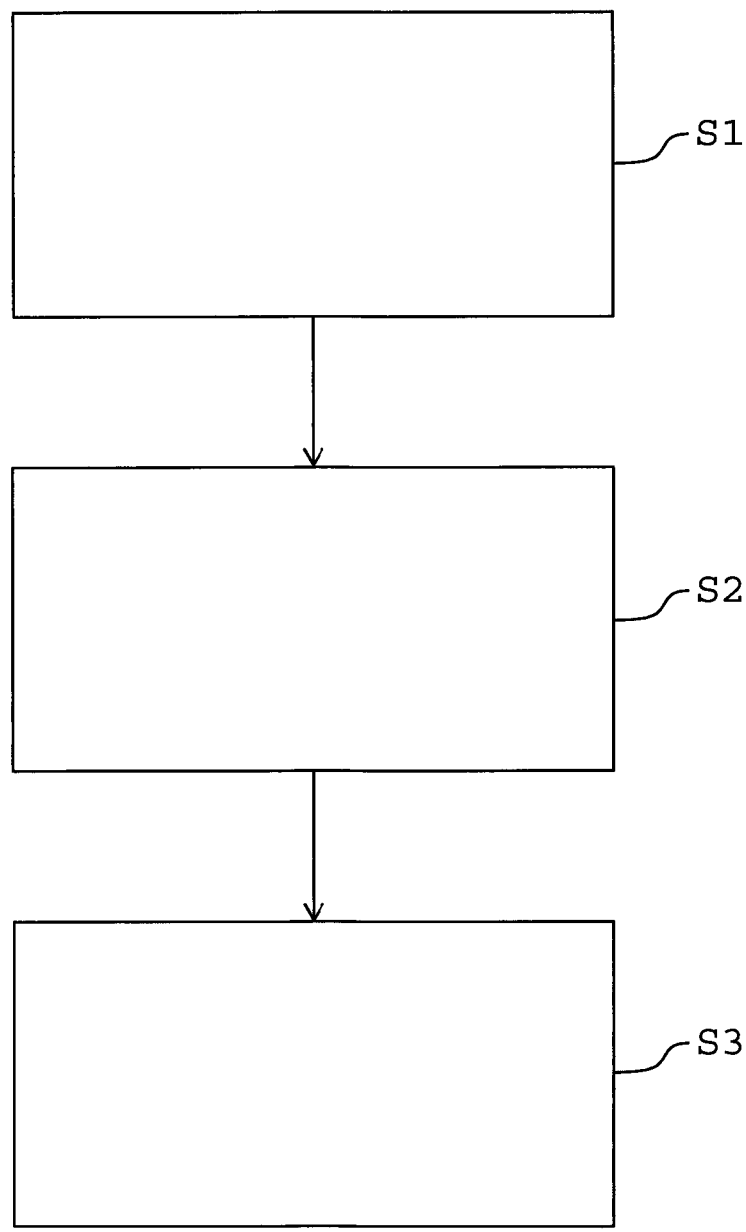
FIG. 22 shows a schematic block diagram of an embodiment of a method for manufacturing a cable receiving device.

FIG. 22 shows a schematic block diagram of an embodiment of a method for manufacturing a cable receiving device 6 as explained above. In a step S1 of the method a magnetic element 7 is provided to absorb electromagnetic radiation. When the magnetic element 7 is provided, it can also be manufactured. The magnetic element 7 can be produced, for example, by injection molding a compound comprising a thermoplastic and a ferrite powder.

In a step S2, a plastic molded part 10 is produced in such a way that the plastic molded part 10 comprises cable guiding sections 14, 15 for guiding the cable strand 2 along its longitudinal direction L and a receiving section 23 for receiving the magnetic element 7.

In a step S3, the magnetic element 7 is fixed in or on the receiving section 23 in a form-locking manner. In steps S2 and S3, the magnetic element 7 can be insert molded or over-injected with plastic material of the plastic molded part 10 in order to firmly connect it to the plastic molded part 10. Furthermore, with the aid of a multi-component injection molding process in steps S1 to S3, the magnetic element 7 can be provided and firmly connected to the plastic molded part 10 by processing a composition comprising a thermoplastic and a ferrite powder in the multi-component injection molding process to provide the magnetic element 7 and by processing another thermoplastic to produce the plastic molded part 10.

In particular, during injection molding of the plastic molded part 10, the receiving section 23 can be represented as a cavity inserted into an injection mold. After injection molding of the plastic molded part 10, the magnetic element 7 can be fixed in the receiving section 23. For this purpose, the plastic molded part 10 can be equipped with latching hooks 26 as mentioned above. Furthermore, the magnetic element 7 can also be positioned in the cavity of the opened injection mold before injection molding of the plastic molded part 10. After closing the mold halves of the injection mold, the magnetic element 7 is insert molded or over-injected during mold filling, thus creating a form-locking and/or material-locking connection between the magnetic element 7 and the plastic molded part 10. Furthermore, the magnetic element 7 can also be insert molded in the injection mold during injection molding in such a way that the captive latching hooks 26 are directly injection molded. Furthermore, the entire plastic molded part 10 can also be produced from the aforementioned compound, which contains the ferrite powder and the thermoplastic. In this way, the entire plastic molded part 10 serves as an electromagnetic absorber after demolding.

Although the present invention was described by means of embodiments, it can be modified in many ways.

LIST OF REFERENCE CHARACTERS

1 Cable harness
2 Cable strand
3 Cable
4 Cable
5A Corrugated tube
5B Corrugated tube
6 Cable receiving device
7 Magnetic element
8 Magnetic element section
9 Magnetic element section
10 Plastic molded part
11 Molded part section
12 Molded part section
13 Hinge
14 Cable guiding section
15 Cable guiding section
16 Half-shell
17 Half-shell
18 Half-shell
19 Half-shell
20 Annular groove
21 Latching hook
22 Recess
23 Receiving section
24 Half-shell
25 Half-shell
26 Latching hook
27 Plastic molded part
28 Half-shell
29 Half-shell
30 Hinge
31 Latching hook
32 Recess
33 Engagement section
34 Bottom
35 Side wall
36 Side wall
37 Bottom
38 Side wall
39 Side wall
40 Breakthrough
41 Breakthrough
42 Bottom
43 Side wall
44 Side wall
45 Fastening element
46 Latching hook
47 Latching hook
48 Actuating element
49 Inlet and/or outlet
50 Inlet and/or outlet
51 Inlet and/or outlet
52 Inlet and/or outlet
53 Inlet and/or outlet
54 Inlet and/or outlet
55 Inlet and/or outlet
56 Cover
57 Cover
58 Cover
59 Cover
L Longitudinal direction
S1 Step
S2 Step
S3 Step
Z1 State
Z2 State

The invention claimed is:
1. A cable receiving device for a cable harness, comprising:

a magnetic element for absorbing electromagnetic radiation, and a plastic molded part comprising:
    a cable guiding section for guiding a cable strand of the cable harness; and
    a receiving section for receiving the magnetic element, the magnetic element being fastened in or on the receiving section in a form-locking manner and/or a material-fit manner, wherein the plastic molded part has a first molded part section and a second molded part section, the first molded part section being pivotably connected to the second molded part section by means of a hinge, or the first molded part section and the second molded part section being two separate components, and the first molded part section and the second molded part section are each U-shaped in cross-section, the first molded part section being arranged at least in sections within the second molded part section, the magnetic element being arranged between the first molded part section and the second molded part section, and the magnetic element being passed through a bottom of the first molded part section, or the second molded part section is divided into a plurality of covers each pivotally connected to the first molded part section by means of a hinge.

2. The cable receiving device according to claim 1, wherein the cable receiving device is configured to connect a first corrugated tube of the cable harness to a second corrugated tube of the cable harness.

3. The cable receiving device according to claim 1, wherein the receiving section has at least one latching hook which engages around the magnetic element in a form-locking manner.

4. The cable receiving device according to claim 1, wherein the magnetic element is in one piece, and wherein the magnetic element is disposed between the first molded part section and the second molded part section.

5. The cable receiving device according to claim 1, wherein the magnetic element is arranged at least sectionally outside and at least sectionally inside the receiving section.

6. The cable receiving device according to claim 1, comprising a first plastic molded part which has the receiving section, and a second plastic molded part which is connected to the first plastic molded part in a form-locking manner.

7. A cable harness with the cable strand and the cable receiving device according to claim 1, wherein the cable strand is guided in or on the cable guiding section, and wherein the cable strand is guided along the magnetic element or is passed through the magnetic element.

8. The cable harness according to claim 7, further comprising a first corrugated tube and a second corrugated tube, wherein the cable receiving device connects the first corrugated tube to the second corrugated tube.

9. A method for manufacturing the cable receiving device according to claim 1 for the cable harness, comprising the following steps:
    a) providing the magnetic element for absorbing electromagnetic radiation,
    b) producing the plastic molded part in such a way that the plastic molded part has the cable guiding section for guiding the cable strand of the cable harness and the receiving section for receiving the magnetic element, and
    c) attaching the magnetic element in or on the receiving section in the form-locking manner and/or the material-fit manner.

10. The method according to claim 9, wherein in steps b) and c) the magnetic element is insert molded or over-molded by plastic material of the plastic molded part.

11. The method according to claim 9, wherein steps a) to c) are carried out by means of a multi-component injection molding method, and wherein the magnetic element is provided by processing in the multi-component injection molding method a composition comprising a thermoplastic and a ferrite powder.

* * * * *